(12) United States Patent
Lee et al.

(10) Patent No.: US 12,371,611 B2
(45) Date of Patent: Jul. 29, 2025

(54) ORGANIC LIGHT-EMITTING DEVICE

(71) Applicant: Samsung Electronics Co., Ltd., Suwon-si (KR)

(72) Inventors: Hasup Lee, Seoul (KR); Sangmo Kim, Hwaseong-si (KR); Eunsuk Kwon, Suwon-si (KR); Jong Soo Kim, Hanam-si (KR); Sungho Nam, Daegu (KR); Minsik Min, Suwon-si (KR); Hyejin Bae, Suwon-si (KR); Hyeonho Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 716 days.

(21) Appl. No.: 17/193,089

(22) Filed: Mar. 5, 2021

(65) Prior Publication Data
US 2021/0328157 A1 Oct. 21, 2021

(30) Foreign Application Priority Data
Apr. 16, 2020 (KR) .................. 10-2020-0046267

(51) Int. Cl.
C09K 11/06 (2006.01)
H10K 50/12 (2023.01)
H10K 85/30 (2023.01)
H10K 85/60 (2023.01)
H10K 101/30 (2023.01)

(52) U.S. Cl.
CPC ............ *C09K 11/06* (2013.01); *H10K 85/346* (2023.02); *H10K 85/633* (2023.02); *C09K 2211/1011* (2013.01); *H10K 50/121* (2023.02); *H10K 85/622* (2023.02); *H10K 2101/30* (2023.02)

(58) Field of Classification Search
None
See application file for complete search history.

(56) References Cited

U.S. PATENT DOCUMENTS

| 10,141,520 B2 | 11/2018 | Oikawa et al. |
| 10,347,851 B2 | 7/2019 | Lennartz et al. |
| 2018/0013073 A1 | 1/2018 | Duan et al. |
| 2018/0312531 A1 | 11/2018 | Pan et al. |
| 2019/0315675 A1* | 10/2019 | Yang .................. C07D 213/74 |
| 2022/0085256 A1* | 3/2022 | Baretz ................ H01L 25/0753 |
| 2023/0132356 A2 | 4/2023 | Kwak et al. |

FOREIGN PATENT DOCUMENTS

KR 20190143282 A 12/2019

OTHER PUBLICATIONS

C. Nguyen, et al., Sensitized fluorescence in organic light emitting diodes, Proceedings of SPIE—Organic Light Emitting Materials and Devices XVIII, edited by Franky So, Proc. of SPIE vol. 9183, 918321-1, 2014 SPIE • CCC code: 0277-786X/14/$18 • doi: 10.1117/12.2068763, 6 pp.

(Continued)

*Primary Examiner* — Jeffrey D Washville
(74) *Attorney, Agent, or Firm* — CANTOR COLBURN LLP

(57) ABSTRACT

Provided is an organic light-emitting device including an emission layer that includes a sensitizer, a fluorescent emitter, and a host.

16 Claims, 2 Drawing Sheets

(56) References Cited

OTHER PUBLICATIONS

Hyun-Gu Kim, et al., Triplet Harvesting by a Fluorescent Emitter Using a Phosphorescent Sensitizer for Blue Organic-Light-Emitting Diodes, ACS Applied Materials and Interfaces, Dec. 13, 2018, 11(1), pp. 26-30.

E. Roy et al., Revised Basis Sets for the LANL Effective Core Potentials, J. Chem. Theory Comput. 2008, 4, 1029-1031.

Lei Zhang, et al., Study on red fluorescent top-emitting organic light-emitting devices using a phosphorescent sensitizer, Display Science and Technology key Lab of Sichuan Province, School of OptoelectronicInformation, University of Electronic Science and Technology of China, 6 pp.

P. J. Stephens et al., J. Phys. Chem. Lett., Ab Initio Calculation of Vibrational Absorption and Circular Dichroism Spectra UsingDensity Functional Force Fields, 1994, 98, 11623-11627.

Paul Heimel, et al., Unicolored phosphor-sensitized fluorescence for efficient and stable blue OLEDs, Nat. Commun., 2018, 9:4990, 8 pp.

Tengxiao Liu, et al., Boosting the Efficiency of Near-Infrared Fluorescent OLEDs with an Electroluminescent Peak of Nearly 800 nm by Sensitizer-Based Cascade Energy Transfer, Advanced Functional Materials 2018, (18), 1706088.

W. J. Hehre et al., Self-Consistent Molecular Orbital Methods. XII. Further Extensions of Gaussian-Type Basis Sets for Use in Molecular Orbital Studies of Organic MoleculesJ. Chem. Phys., 1972, 56, 2257-2261.

Y. Zhao et al., Hybrid Meta Density Functional Theory Methods for Thermochemistry, Thermochemical Kinetics, and Noncovalent Interactions: The MPW1B95 and MPWB1K Models and Comparative Assessments for Hydrogen Bonding and van der Waals Interactions, J. Phys. Chem. A, 2004, 108, 6908-6918.

Su Kyeong Shin et al., "High triplet energy exciplex host derived from a CN modified carbazole based n-type host for improved efficiency and lifetime in blue phosphorescent organic light-emitting diodes," J. Mater. chem. C. 2018, 6, 10308, 7 pp.

Tyler Fleetham et al., "Development of Tetradentate Pt Complexes for Efficient, Stable, and High Color Purity Blue OLEDs," Invited Paper, SID 2015 DIGEST, 4 pp.

Korean Office Action for KR Patent Application No. 10-2020-0046267 dated Jun. 5, 2024.

\* cited by examiner

ORGANIC LIGHT-EMITTING DEVICE

CROSS-REFERENCE TO RELATED APPLICATION

This application claims priority to and the benefit of Korean Patent Application No. 10-2020-0046267, filed on Apr. 16, 2020, in the Korean Intellectual Property Office, the content of which is incorporated herein in its entirety by reference.

BACKGROUND

1. Field

One or more embodiments relate to an organic light-emitting device.

2. Description of Related Art

Organic light-emitting devices are self-emission devices that produce full-color images, and also have wide viewing angles, high contrast ratios, short response times, and excellent characteristics in terms of brightness, driving voltage, and response speed, compared to devices in the art.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit from an excited state to a ground state to thereby generate light.

SUMMARY

One or more embodiments include an organic light-emitting device emitting fluorescence with a relatively small full-width at half maximum (FWHM) and having high efficiency and long lifespan.

Additional aspects will be set forth in part in the description which follows and, in part, will be apparent from the description, or may be learned by practice of the presented embodiments of the disclosure.

According to one or more embodiments, an organic light-emitting device includes a first electrode, a second electrode facing the first electrode, and an organic layer between the first electrode and the second electrode, wherein the organic layer includes an emission layer, the emission layer includes a sensitizer, a fluorescent emitter, and a host, the sensitizer includes ruthenium (Ru), palladium (Pd), rhenium (Re), osmium (Os), or platinum (Pt), and the sensitizer and the fluorescent emitter satisfy Inequality 1 below:

$$|E_{adia}^{T1}(SE) - E_{vert}^{S1}(FL)| < 0.2 \text{ eV}.\qquad\text{Inequality 1}$$

In Inequality 1, $E_{adia}^{T1}(SE)$ indicates an adiabatic triplet excitation energy of the sensitizer, and $E_{vert}^{S1}(FL)$ indicates vertical singlet excitation energy of the fluorescent emitter.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
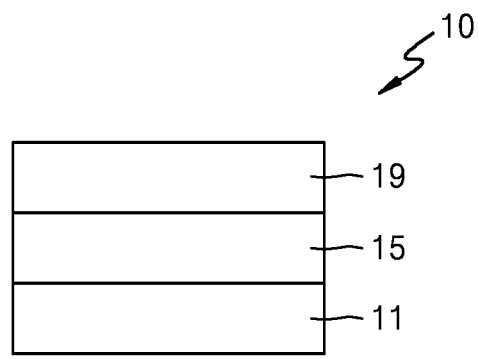
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

According to one or more embodiments, an organic light-emitting device includes a first electrode, a second electrode facing the first electrode, and an organic layer disposed between the first electrode and the second electrode and including an emission layer.

In one or more embodiments, the emission layer may include a sensitizer, a fluorescent emitter, and a host.

In one or more embodiments, the sensitizer and the fluorescent emitter may satisfy Inequality 1 below:

$$|E_{adia}^{T1}(SE) - E_{vert}^{S1}(FL)| < 0.2 \text{ eV}.$$  Inequality 1

In Inequality 1, $E_{adia}^{T1}(SE)$ indicates adiabatic triplet excitation energy of the sensitizer, and $E_{vert}^{S1}(FL)$ indicates vertical singlet excitation energy of the fluorescent emitter.

In the present specification, the term "adiabatic excitation energy" as used herein refers to a difference between an energy level of the excited state ($E_1$) at a stable point and an energy level of the ground state ($E_0$) at a stable point. For example, the term "adiabatic triplet excitation energy" as used herein refers to a difference between an energy level of the lowest excitation triplet (T1) ($E_1^{T1}$) at a stable point and an energy level of the ground state (S0) ($E_0$) at a stable point.

In the present specification, the term "vertical excitation energy" as used herein refers to a difference between an energy level of the ground state (S0) ($E_0$) at a stable point and an energy level of the excitation state ($E_2$) at a vertical transition point (Franck-Condon point) to the $E_0$. For example, the term "vertical singlet excitation energy" as used herein refers to a difference between an energy level of the ground state (S0) ($E_0$) at a stable point and an energy level of the lowest excitation singlet (S1) ($E_2^{S1}$) at a vertical transition point (Franck-Condon point) to the $E_0$.

Figure 2:
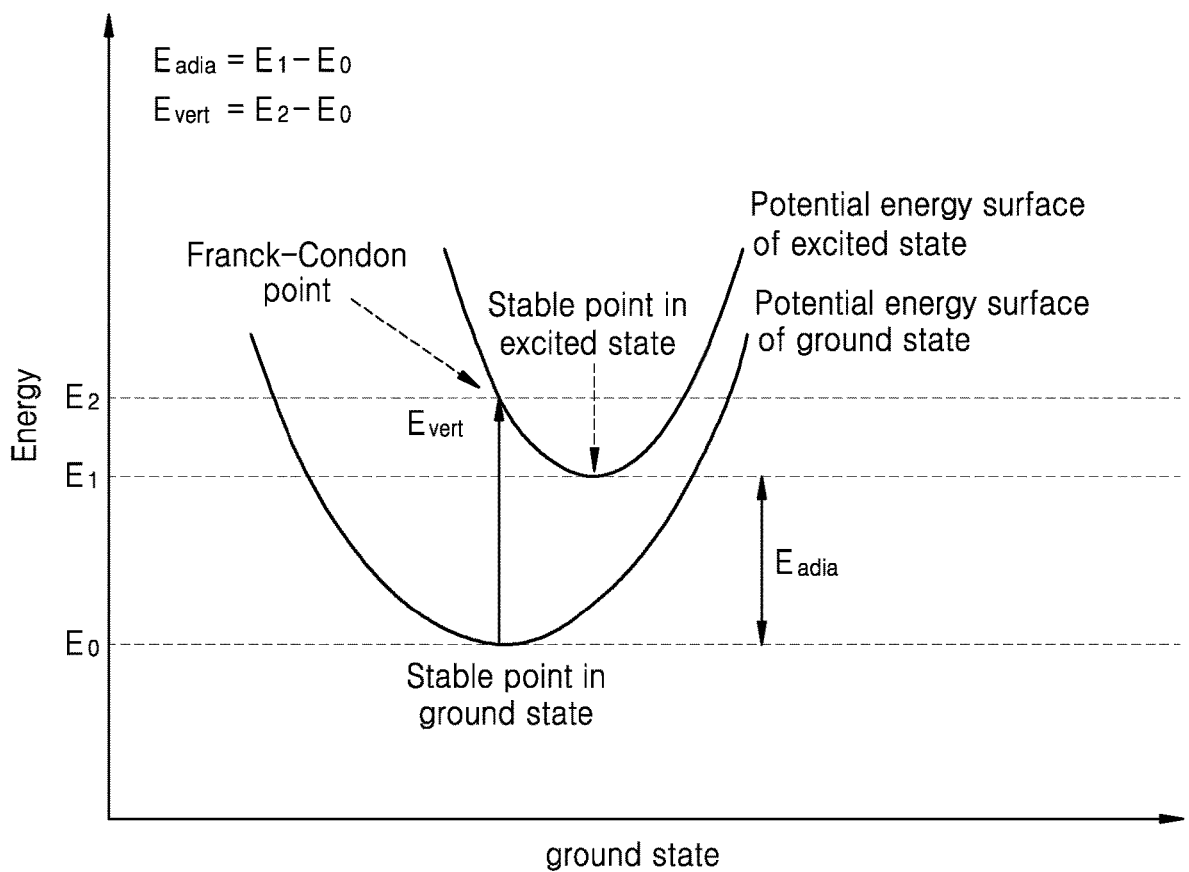
FIG. 2 is an energy diagram for facilitating understanding of adiabatic excitation energy and vertical excitation energy.

The terms "adiabatic excitation energy" and "vertical excitation energy" may be understood by referring to FIG. 2.

When the organic light-emitting device according to an embodiment satisfies Inequality 1 above, the Förster energy transfer rate between the sensitizer and the fluorescent emitter is increased, so that the triplet T1 excitons of the sensitizer may be easily transferred to the singlet S1 excitons of the fluorescent emitter, thereby emitting fluorescence.

Here, when the sensitizer includes rhenium (Re), palladium (Pd), rhenium (Re), osmium (Os), or platinum (Pt), the radiative decay rate of the sensitizer may be in microseconds (µs) while the radiative decay rate of the fluorescent emitter may be in nanoseconds (ns). Accordingly, it is understood that the radiative decay rate may be significantly reduced by the Forster energy transfer, thereby improving efficiency and lifespan of the organic light-emitting device.

In addition, the Forster energy transfer is generally characterized by excitons being transferred between singlet terms. However, the sensitizer of the organic light-emitting device of the present disclosure includes Ru, Pd, Re, Os, or Pt so that triplet excitons may be transferred into a singlet state, thereby emitting fluorescence.

Therefore, the luminescence may be achieved by the fluorescent emitter included in the emission layer of the organic light-emitting device, and accordingly, the fluorescence luminescence spectrum with excellent color purity based on the fluorescent emitter may be implemented. Furthermore, the fluorescence emission with a relatively short exciton lifespan may be achieved, such that a phenomenon of lowering the efficiency under high luminance (so-called a roll-off phenomenon), which may occur due to interactions between a plurality of excitons (i.e., exciton-to-exciton interactions) or exciton-to-charge (e.g., holes or electrons) interactions (i.e., exciton-to-polaron interactions), may be suppressed, thereby implementing an organic light-emitting device having high efficiency.

In the present specification, the singlet energy and the triplet energy are calculated by using a Gaussian 09 package according to a quantum chemistry calculation based on density functional theory (DFT) and time-dependent density functional theory (TD-DFT).

For example, for the sensitizer, the DFT method was used to optimize the ground state (S0) structure and the triplet (T1) structure using the B3LYP density function, and to calculate the adiabatic triplet excitation energy based on the difference between the ground state S0 structure and the triplet T1 structure. Here, as the basis set, LanL2TZ was used for the central metal, and 6-31G(d,p) was used for other atoms.

In addition, for example, for the fluorescent emitter, the DFT method was used to optimize the ground state S0 structure using an MPW1B95 density function and a 6-31G (d,p) basis set, and also used the TD-DFT method to calculate the vertical singlet excitation energy.

In one or more embodiments, the sensitizer and the fluorescent emitter may satisfy Inequality 1-1 below:

$|E_{adia}^{T1}(SE) - E_{vert}^{S1}(FL)| < 0.15$ eV.  Inequality 1-1

In one or more embodiments, the sensitizer may include an organometallic compound represented by Formula 101 below:

$M_{11}(L_{11})_{n11}(L_{12})_{n12}$.  Formula 101

In Formula 101, $M_{11}$ may be Ru, Pd, Re, Os, or Pt;

$L_{11}$ may be a ligand represented by one of Formulae 1-1 to 1-4 below;

$L_{12}$ is a monodentate ligand or a bidentate ligand;

n11 may be 1; and n12 may be 0, 1, or 2, wherein when n12 is 2, then each occurrence of $L_{12}$ is the same or different,

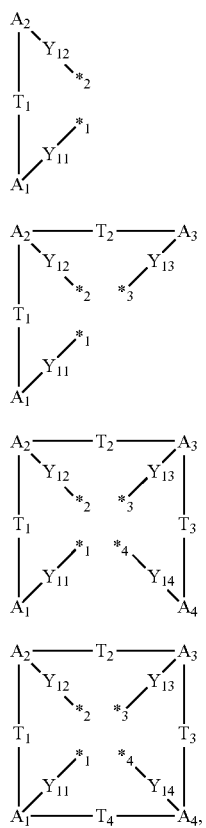

wherein, in Formulae 1-1 to 1-4, $A_1$ to $A_4$ are each independently a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ are each independently a chemical bond, O, S, $N(R_{91})$, $B(R_{91})$, $P(R_{91})$, or $C(R_{91})(R_{92})$, $T_1$ to $T_4$ may each independently be a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*'—O—*', *—C(=O)—*', *—S(=O)—*', *—S(=O)$_2$—*', *—$C(R_{93})$=*', *=$C(R_{93})$—*', *—$C(R_{93})$=$C(R_{94})$—*', *—C(=S)—*', or *—C≡C—*', a substituent of the $C_5$-$C_{30}$ carbocyclic group, a substituent of the substituted $C_1$-$C_{30}$ heterocyclic group, and $R_{91}$ to $R_{94}$ may each independently be hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), *$_1$, *$_2$, *$_3$, and *$_4$ each indicate a binding site to Mu, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, or a $C_6$-$C_{60}$ aryl group, or any combination thereof, a $C_6$-$C_{60}$ aryl group that is substituted with deuterium, —F, a cyano group, a $C_1$-$C_{60}$ alkyl group, a $C_6$-$C_{60}$ aryl group, or any combination thereof.

The substituent of the $C_5$-$C_{30}$ carbocyclic group and the substituent of the substituted $C_1$-$C_{30}$ heterocyclic group each may not be hydrogen.

For example, the sensitizer may include an organometallic compound represented by Formula 111 below:

Formula 111

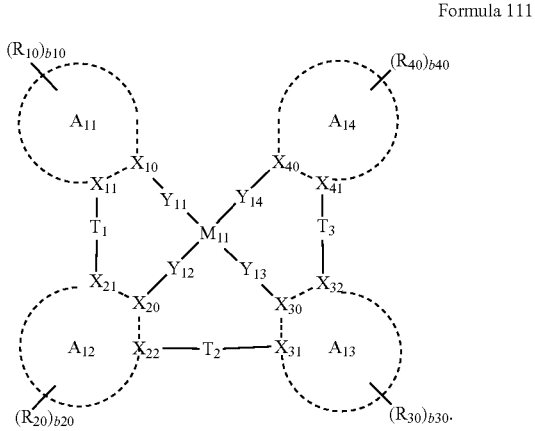

In Formula 111, $A_{11}$ to $A_{14}$ may each independently be a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ and $T_1$ to T3 may each be the same as described in the present specification, $X_{10}$, $X_{11}$, $X_{20}$ to $X_{22}$, $X_{30}$ to $X_{32}$, $X_{40}$, and $X_{41}$ may each independently be C or N, $R_{10}$, $R_{20}$, $R_{30}$, and $R_{40}$ may each independently be hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —B(Q$_1$)(Q$_2$), —N(Q$_1$)(Q$_2$), —P(Q$_1$)(Q$_2$), —C(=O)(Q$_1$), —S(=O)(Q$_1$), —S(=O)$_2$ (Q$_1$), —P(=O)(Q$_1$)(Q$_2$), or —P(=S)(Q$_1$)(Q$_2$), b10, b20, b30, and b40 may each independently be an integer from 1 to 10, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{60}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, and a $C_6$-$C_{60}$ aryl group, and a $C_6$-$C_{60}$ aryl group that is substituted with deuterium, —F, a cyano group, a $C_1$-$C_{60}$ alkyl group, or a $C_6$-$C_{60}$ aryl group.

The substituent of the $C_5$-$C_{30}$ carbocyclic group and the substituent of the substituted $C_1$-$C_{30}$ heterocyclic group may not be each hydrogen.

In one or more embodiments, the sensitizer may include Pt, Pd, or gold (Au). For example, the sensitizer may include Pt.

For example, $M_{11}$ in Formula 101 or 111 may be Pt, Pd, or Au. In one or more embodiments, $M_{11}$ in Formula 101 or 111 may be Pt.

In one or more embodiments, $A_{11}$ to $A_{14}$ in Formula 111 may each independently be:

a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

In one or more embodiments, $A_{11}$ may be a group represented by one of A10-1 to A10-20 below:

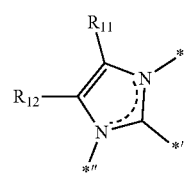

A10-1

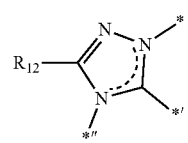

A10-2

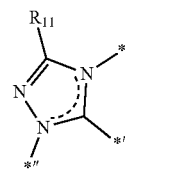

A10-3

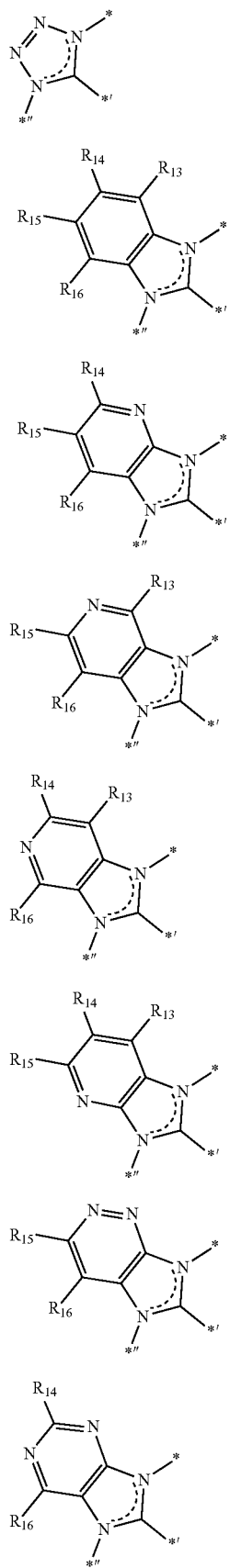

-continued

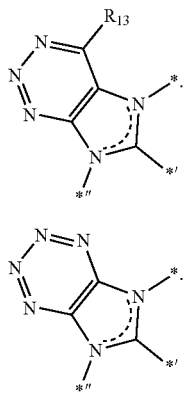

A10-19

A10-20

In Formulae A10-1 to A10-20, $R_{11}$ and $R_{12}$ may each independently be the same as described in connection with $R_{10}$, $R_{13}$ to $R_{10}$ may each independently be the same as described in connection with $R_{11}$ and $R_{12}$, and

*, *', and *" each indicate a binding site to a neighboring atom.

In one or more embodiments, a bond between $M_{11}$ and $X_{10}$, a bond between $M_{11}$ and $X_{20}$, a bond between $M_{11}$ and $X_{30}$, and a bond between $M_{11}$ and $X_{40}$ may each independently be a coordinate bond or a covalent bond.

In Formula 1, two bonds of a bond between $M_{11}$ and $X_{10}$, a bond between Mu and $A_{20}$, and a bond between $M_{11}$ and A30 may each be a covalent bond, and the bonds that are not covalent bonds may be coordinate bonds.

Thus, the organometallic compound represented by Formula 1 may be electrically neutral.

In one or more embodiments, a bond between $M_{11}$ and $A_{20}$ may be a covalent bond, a bond between $M_{11}$ and A30 may be a covalent bond, and a bond between $M_{11}$ and $A_{40}$ may be a coordinate bond.

In one or more embodiments, $R_{10}$, $R_{20}$, $R_{30}$, and $R_{40}$ in Formula 111 may each independently be: hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —SF$_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or —N(Q$_1$)(Q$_2$), —Si(Q$_3$)(Q$_4$)(Q$_5$), —B(Q$_6$)(Q$_7$), or —P(=O)(Q$_8$)(Q$_9$), Q$_1$ to Q$_9$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CH$_3$, —CD$_2$CD$_3$, —CD$_2$CD$_2$H, or —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one deuterium, a C$_1$ to C$_{10}$ alkyl group, a phenyl group, or any combination thereof.

In one or more embodiments, R$_{10}$, R$_{20}$, R$_{30}$, and R$_{40}$ may each independently hydrogen, deuterium, —F, —CF$_3$, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-19, or a group represented by one of Formulae 10-1 to 10-194:

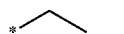

9-1

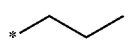

9-2

9-3

9-4

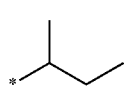

9-5

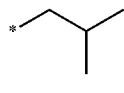

9-6

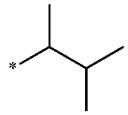

9-7

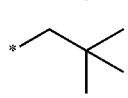

9-8

-continued

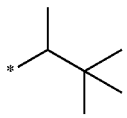

9-9

9-10

9-11

9-12

9-13

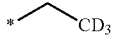

9-14

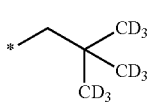

9-15

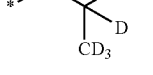

9-16

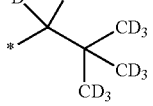

9-17

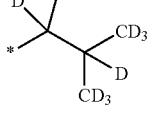

9-18

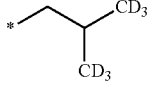

9-19

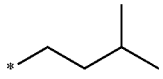

10-1

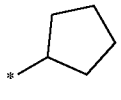

10-2

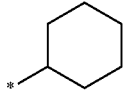

10-3

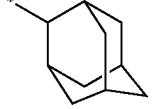

10-4

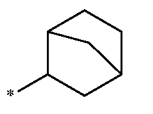

10-5

-continued
| | |
|---|---|
| 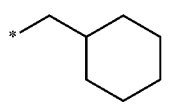 | 10-6 |
| 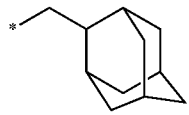 | 10-7 |
| 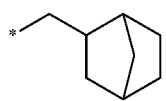 | 10-8 |
| 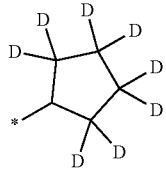 | 10-9 |
| 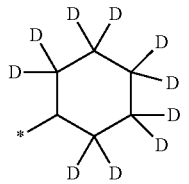 | 10-10 |
| 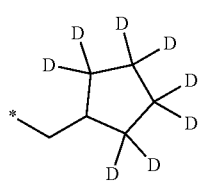 | 10-11 |
| 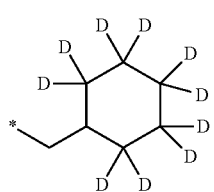 | 10-12 |
| 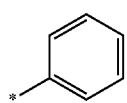 | 10-13 |
| 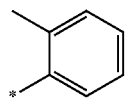 | 10-14 |
| 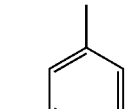 | 10-15 |
| 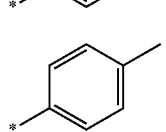 | 10-16 |
-continued
| | |
|---|---|
| 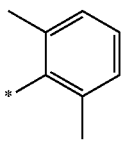 | 10-17 |
| 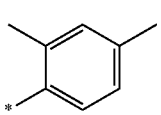 | 10-18 |
| 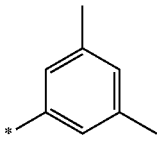 | 10-19 |
| 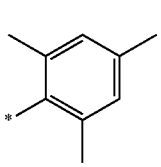 | 10-20 |
| 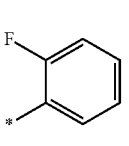 | 10-21 |
| 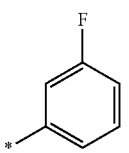 | 10-22 |
| 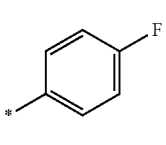 | 10-23 |
| 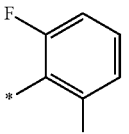 | 10-24 |
| 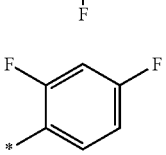 | 10-25 |
| 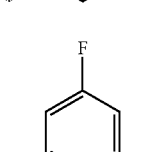 | 10-26 |
| 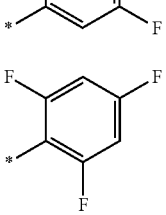 | 10-27 |

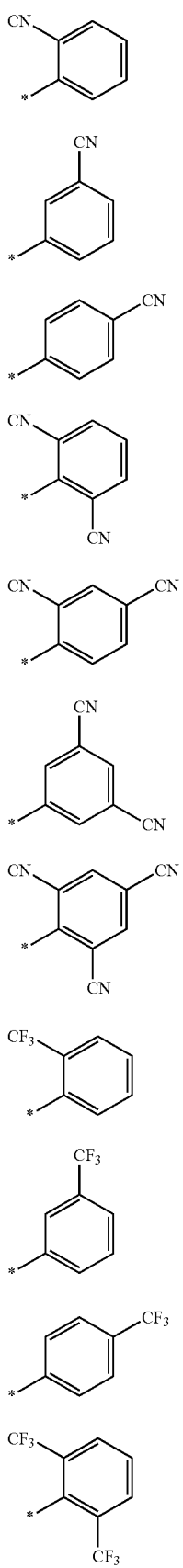
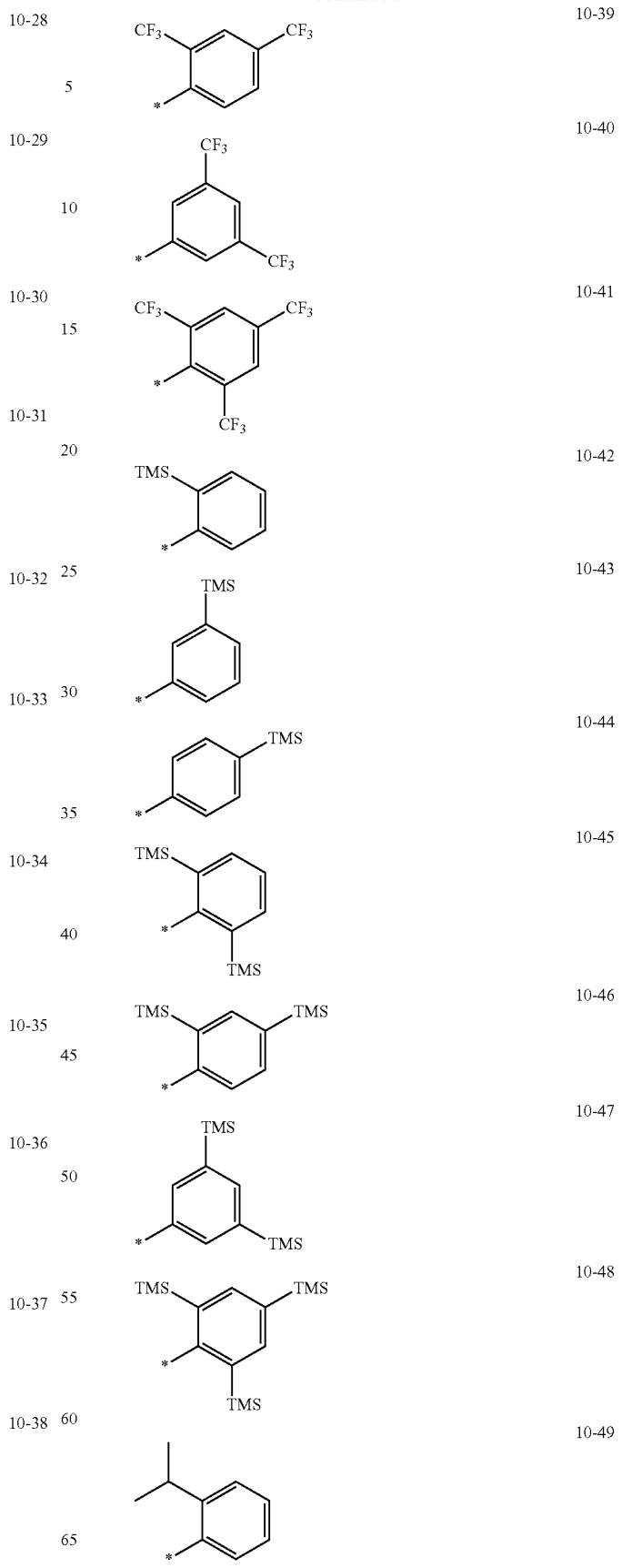

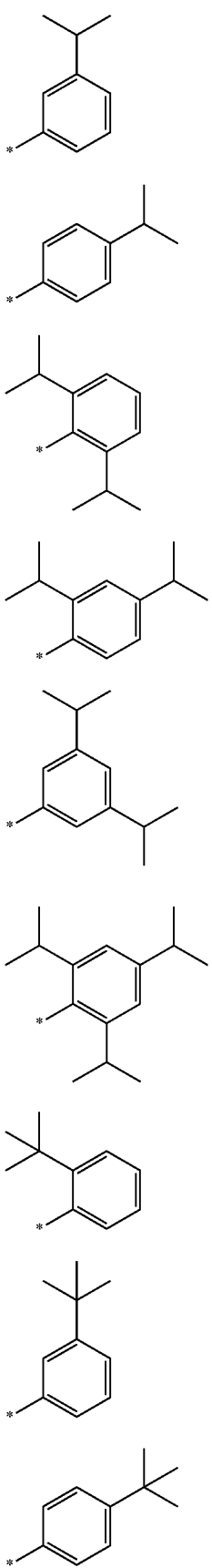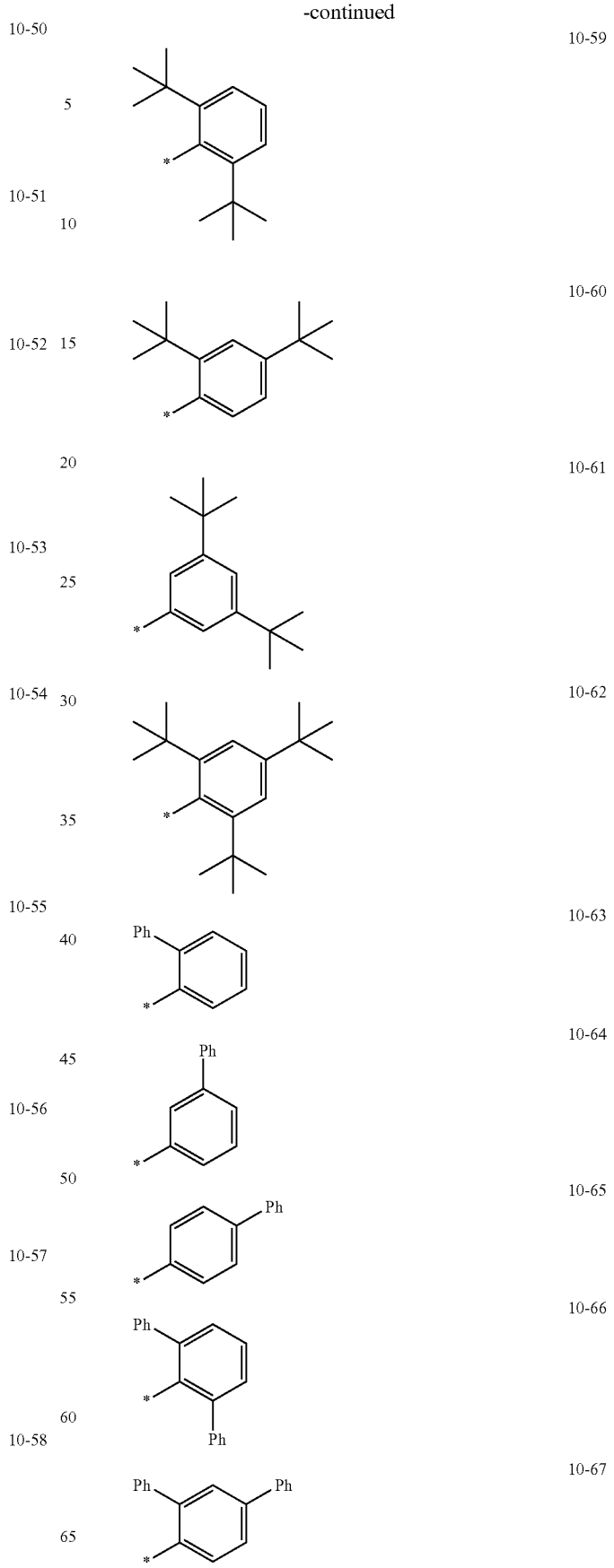

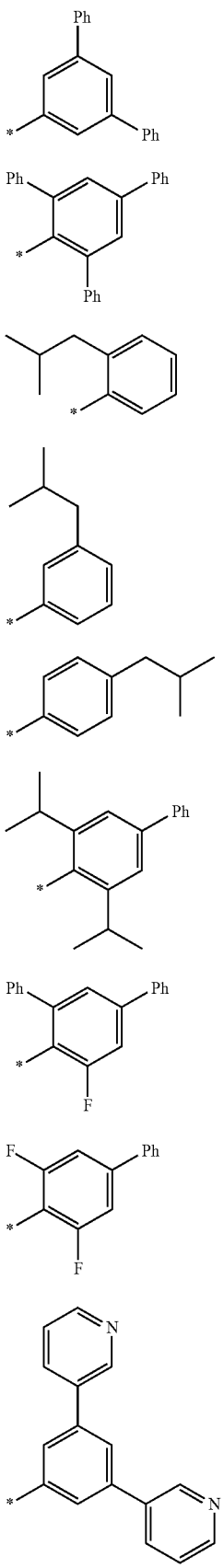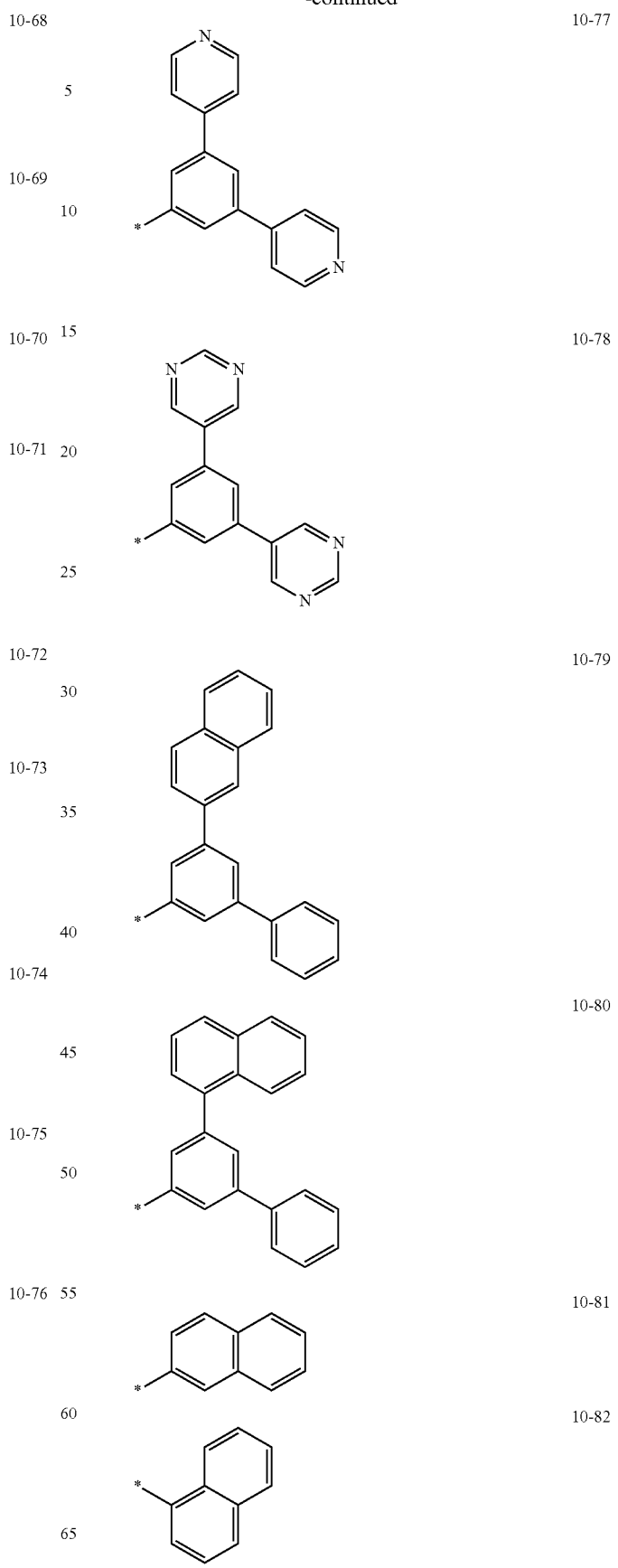

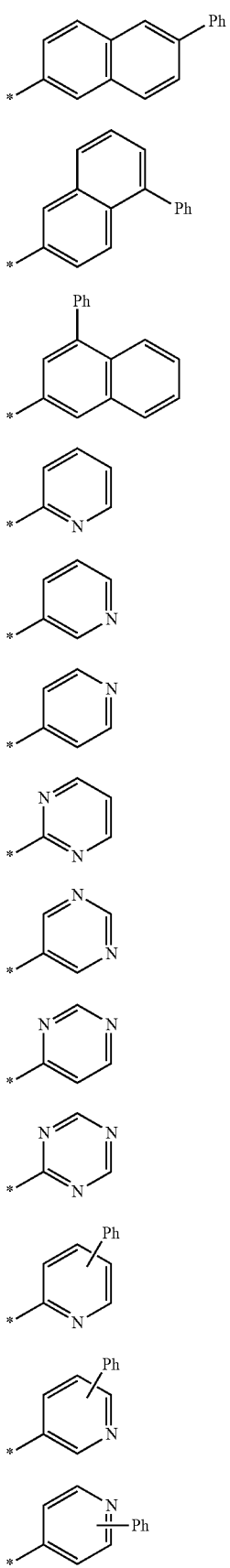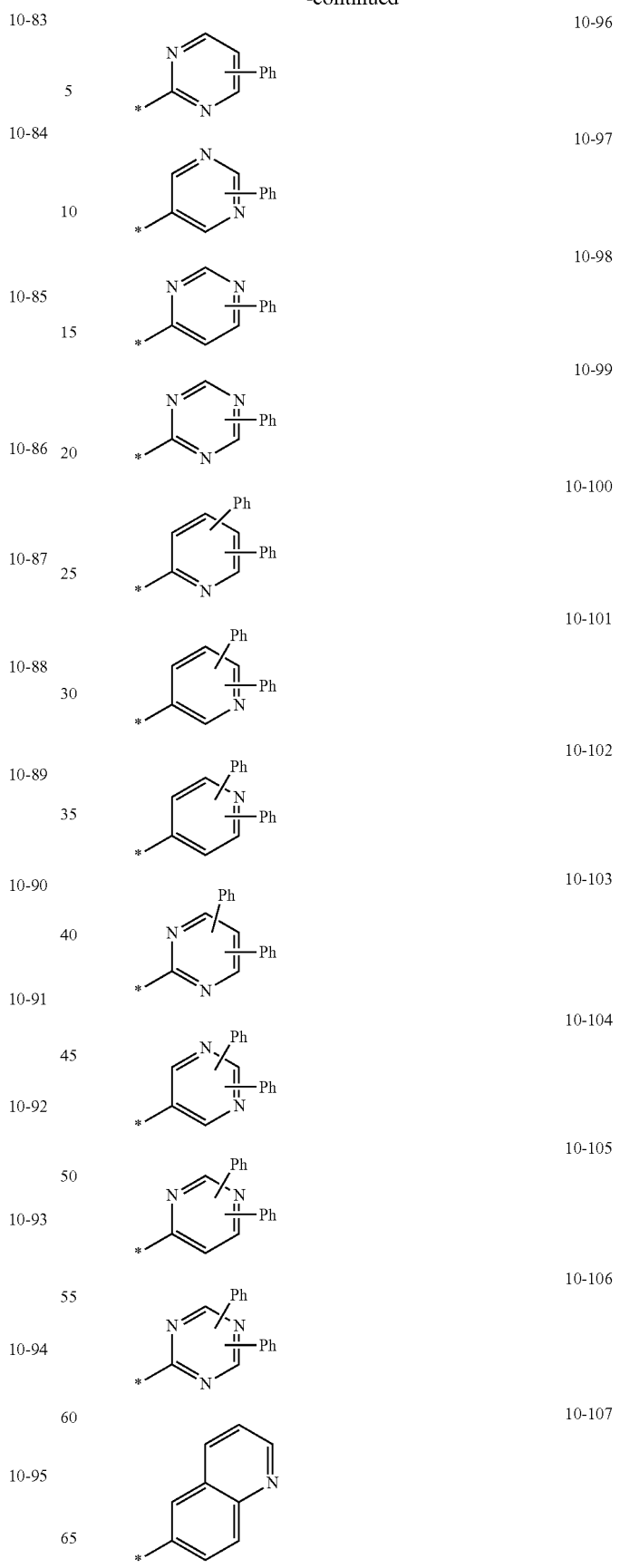

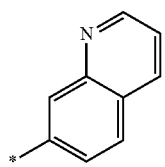
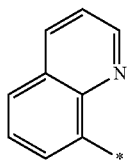
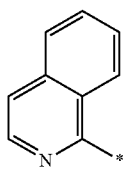
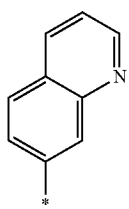
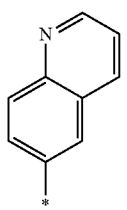
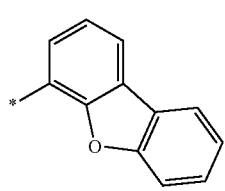
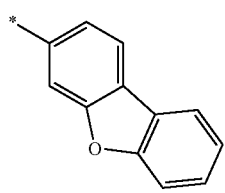
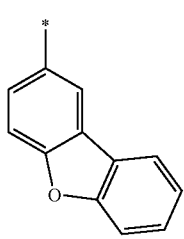
10-108
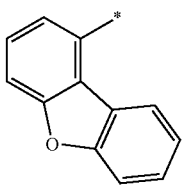
10-109
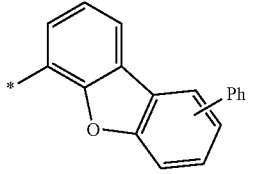
10-110
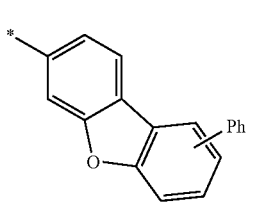
10-111
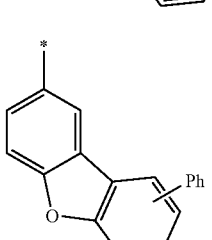
10-112
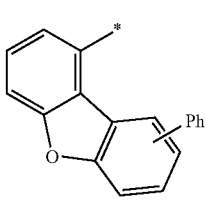
10-113
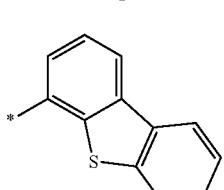
10-114
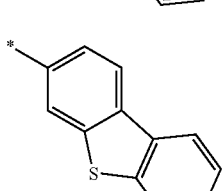
10-115
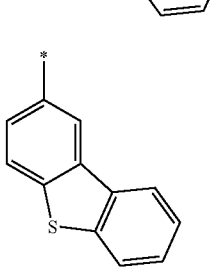
10-116
10-117
10-118
10-119
10-120
10-121
10-122
10-123

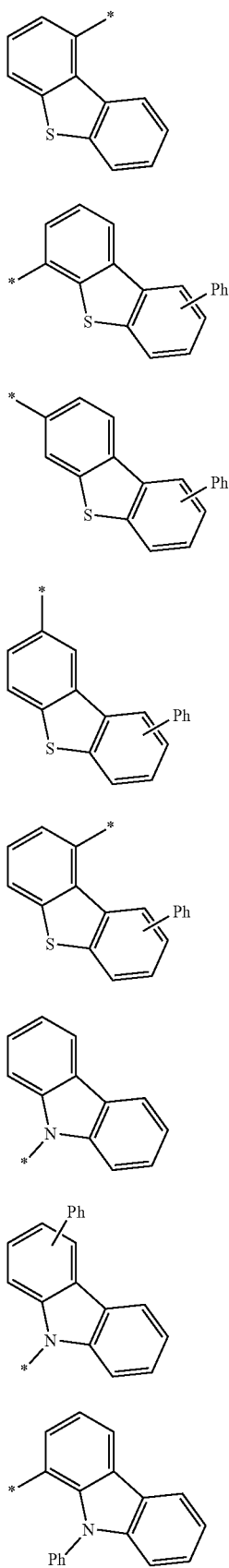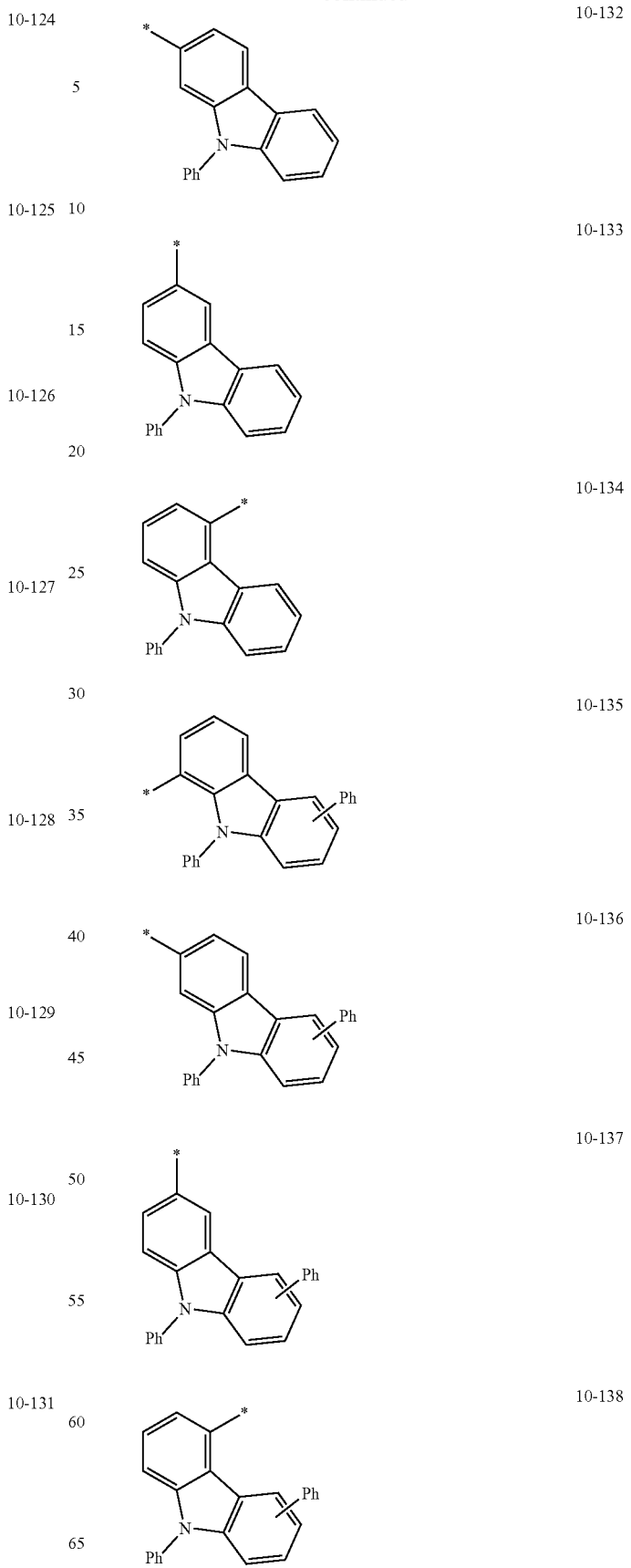

-continued
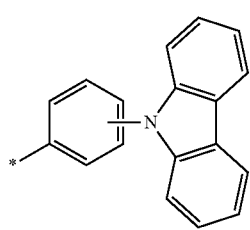
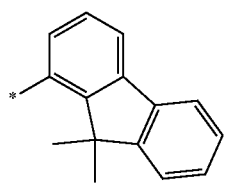
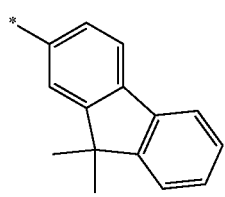
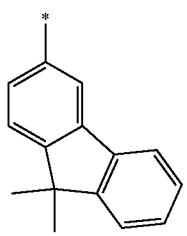
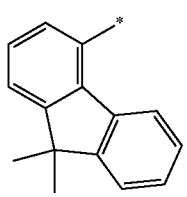
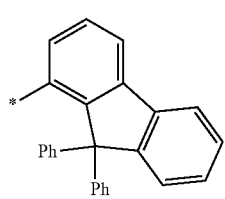
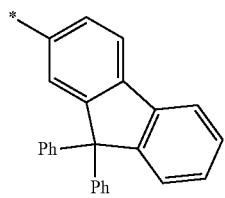
-continued
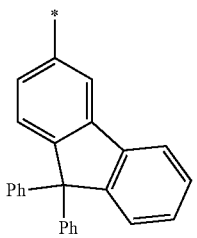 10-146
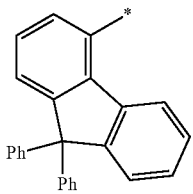 10-147
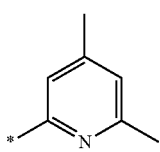 10-148
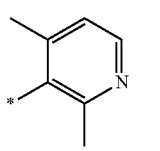 10-149
10-150
10-151
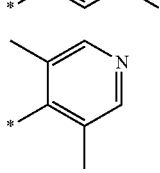 10-152
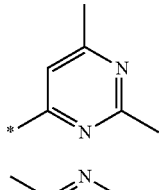 10-153
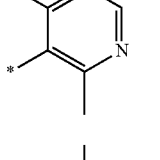 10-154
10-155

-continued
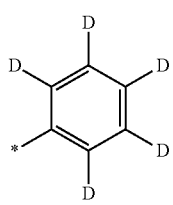
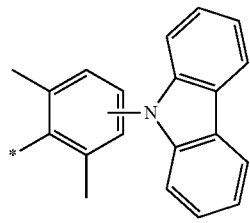
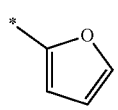
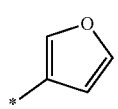
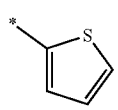
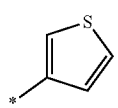
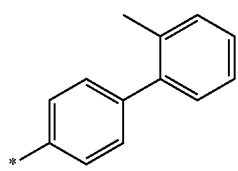
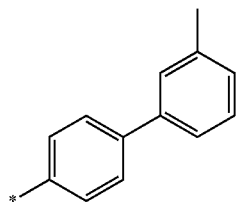
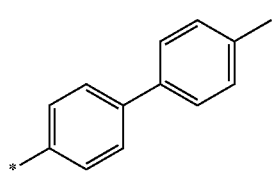
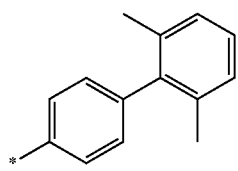
-continued
10-156
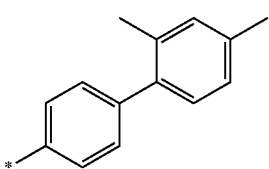
10-157
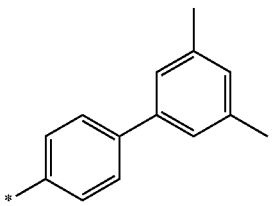
10-158
10-159
10-160
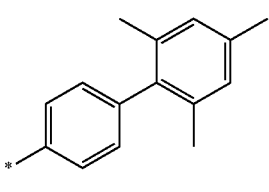
10-161
10-162
10-163
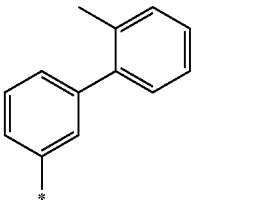
10-164
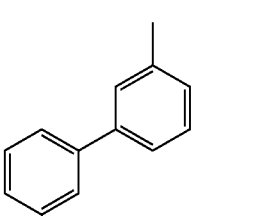
10-165
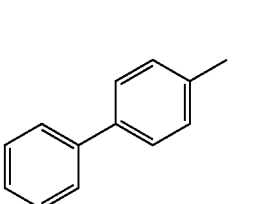
10-166
10-167
10-168
10-169
10-170
10-171
10-172
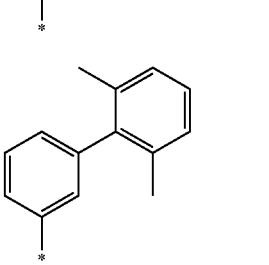

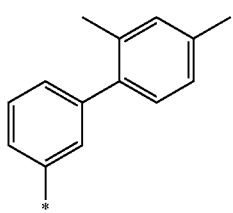
10-173
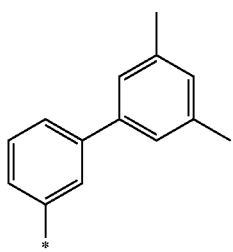
10-174
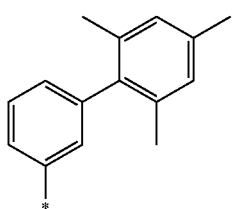
10-175
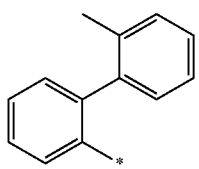
10-176
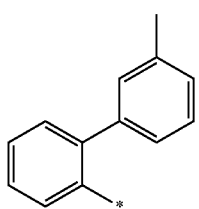
10-177
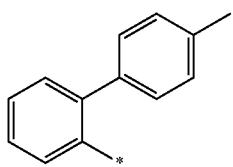
10-178
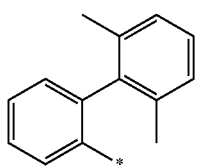
10-179
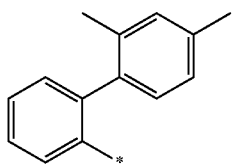
10-180
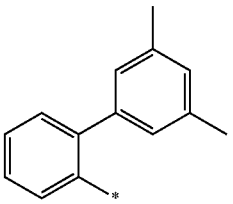
10-181
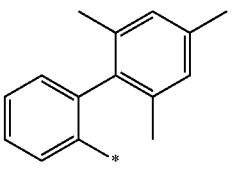
10-182
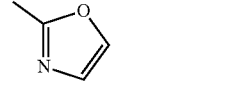
10-183
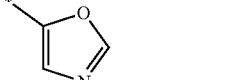
10-184
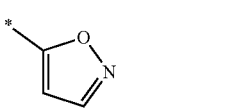
10-185
10-186
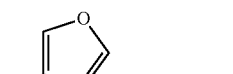
10-187
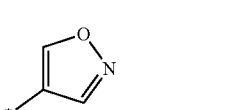
10-188
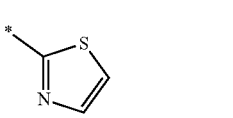
10-189
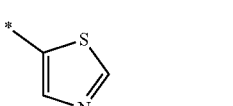
10-190
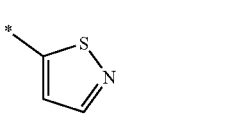
10-191
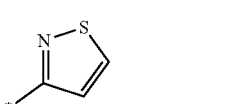
10-192
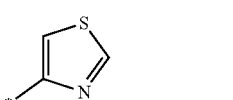
10-193

-continued 10-194

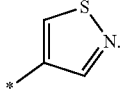

In Formulae 9-1 to 9-19 and 10-1 to 10-194, * indicates a binding site to a neighboring atom, Ph indicates a phenyl group, and TMS indicates a trimethylsilyl group.

In one or more embodiments, the organometallic compound represented by Formula 111 may be represented by Formulae 121 or 122:

Formula 121

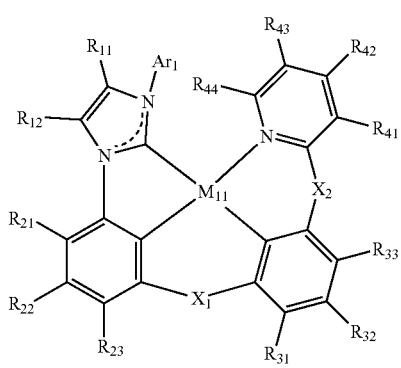

Formula 122

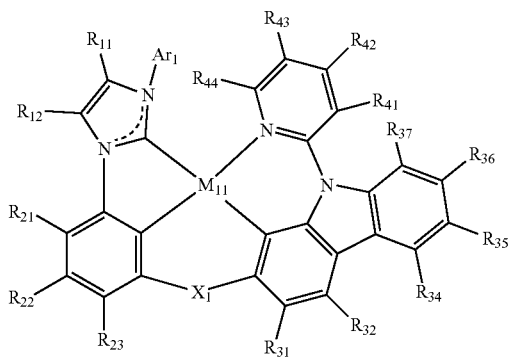

In Formulae 121 and 122, $M_{11}$, $Ar_1$, $R_{11}$, and $R_{12}$ may be the same as described in the present specification, $X_1$ may be O or S, and $X_2$ may be a single bond, O, or S, $R_{21}$ to $R_{23}$ may each independently be the same as described in connection with $R_{20}$, $R_{31}$ to $R_{37}$ may each independently be the same as described in connection with $R_{30}$, and $R_{41}$ to $R_{44}$ may each independently be the same as described in connection with $R_{40}$, and two or more of neighboring groups of $R_{21}$ to $R_{23}$, $R_{31}$ to $R_{33}$, and $R_{41}$ to $R_{44}$ may optionally be linked together to form a benzene ring or a naphthalene ring.

A substituent of the substituted $C_5$-$C_{30}$ carbocyclic group, the substituted $C_1$-$C_{30}$ heterocyclic group, the substituted $C_1$-$C_{60}$ alkyl group, the substituted $C_6$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a Cr C$_{60}$ alkoxy group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{1}$s), —B(Q$_{16}$)(Q$_{17}$), —P(=O)(Q$_{18}$)(Q$_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), —P(=O)(Q$_{28}$)(Q$_{29}$), or any combination thereof; or —N(Q$_{31}$)(Q$_{32}$), —Si(Q$_{33}$)(Q$_{34}$)(Q$_{35}$), —B(Q$_{36}$)(Q$_{37}$), or —P(=O)(Q$_{38}$)(Q$_{39}$), $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

In one or more embodiments, the sensitizer may include at least one of Compounds PD1 and PD2:

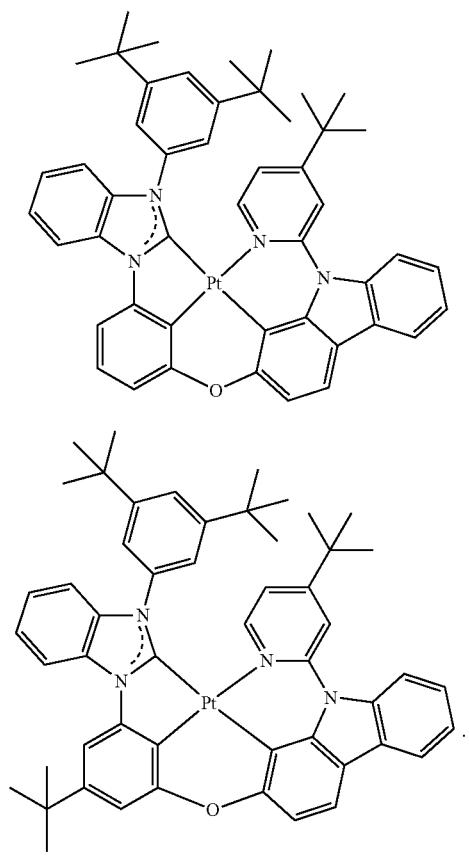

PD1

PD2

In one or more embodiments, the sensitizer may emit fluorescence by transferring the excitons provided from the host to the fluorescent emitter according to the Forster energy transfer, thereby increasing the luminance decay rate of the fluorescent emitter.

In one or more embodiments, a luminescence spectrum of the sensitizer in a film state may have a FWHM in a range of about 10 nm to about 50 nm, for example, about 13 nm to about 30 nm.

For example, when the sensitizer includes Pt, the FWHM is narrow. That is, the color purity of the organic light-emitting device may be improved, and accordingly, may be suitable for luminescence of deep blue light.

In the present specification, the term "film state" as used herein does not refer to a solution state, but refers to a state prepared in the form of a film by using the compound represented by Formula 1 only or by mixing the compound represented by Formula 1 with other components which do not adversely affect measuring a FWHM and a quantum efficiency.

Fluorescent Emitter

The fluorescent emitter may not include a metallic atom.

In one or more embodiments, the fluorescent emitter may be a condensed cyclic group-containing compound, an amino-containing compound, a styryl-containing compound, or a boron-containing compound.

In one or more embodiments, the fluorescent emitter may include at least one of a naphthalene-containing compound, a fluorene-containing compound, a spiro-bifluorene-containing compound, a benzofluorene-containing compound, a dibenzofluorene-containing compound, a phenanthrene-containing compound, an anthracene-containing compound, a fluoranthene-containing compound, a triphenylene-containing compound, a pyrene-containing compound, a chrysene-containing compound, a naphthacene-containing compound, a picene-containing compound, a perylene-containing compound, a pentaphene-containing compound, an indenoanthracene-containing compound, a tetracene-containing compound, a bisanthracene-containing compound, or a group represented by one of Formulae 501-1 to 501-21 below:

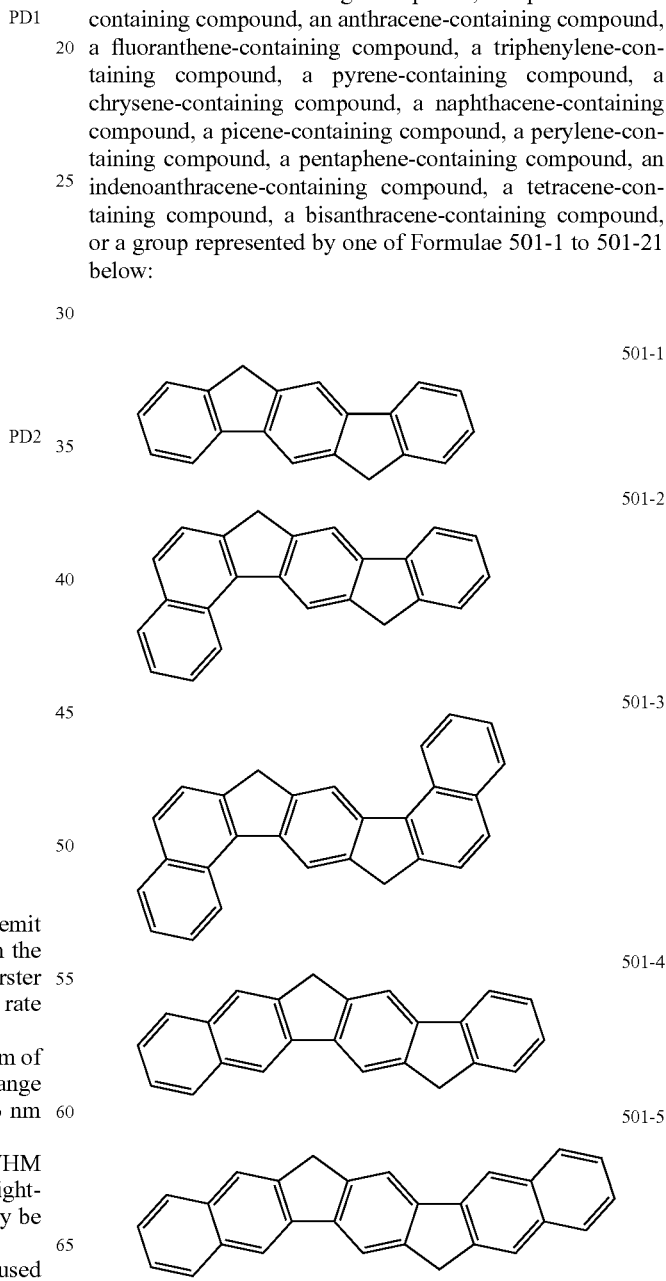

501-1

501-2

501-3

501-4

501-5

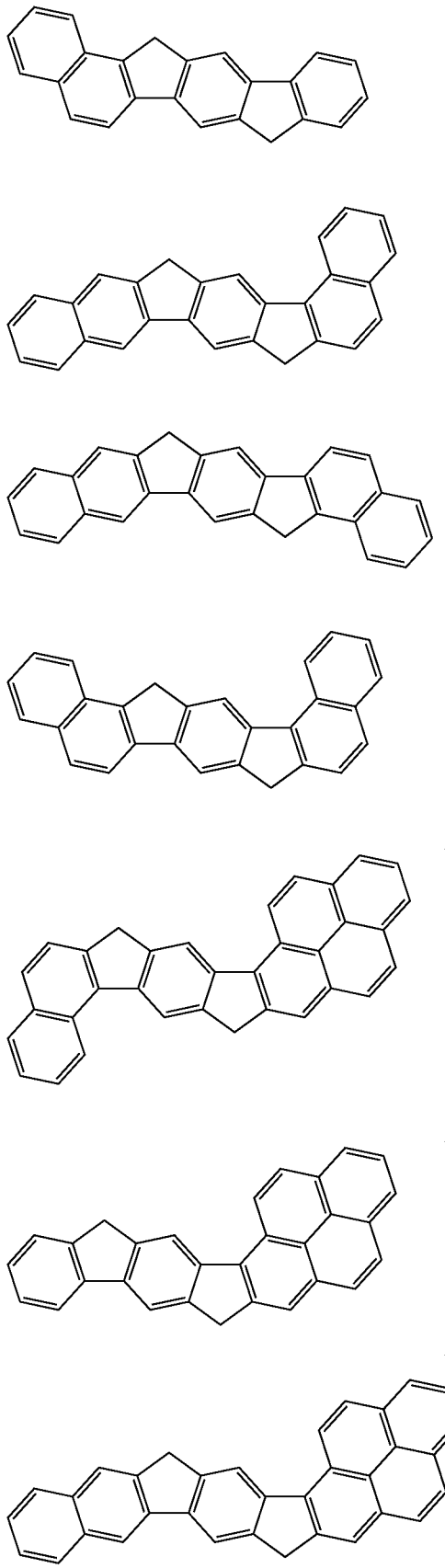
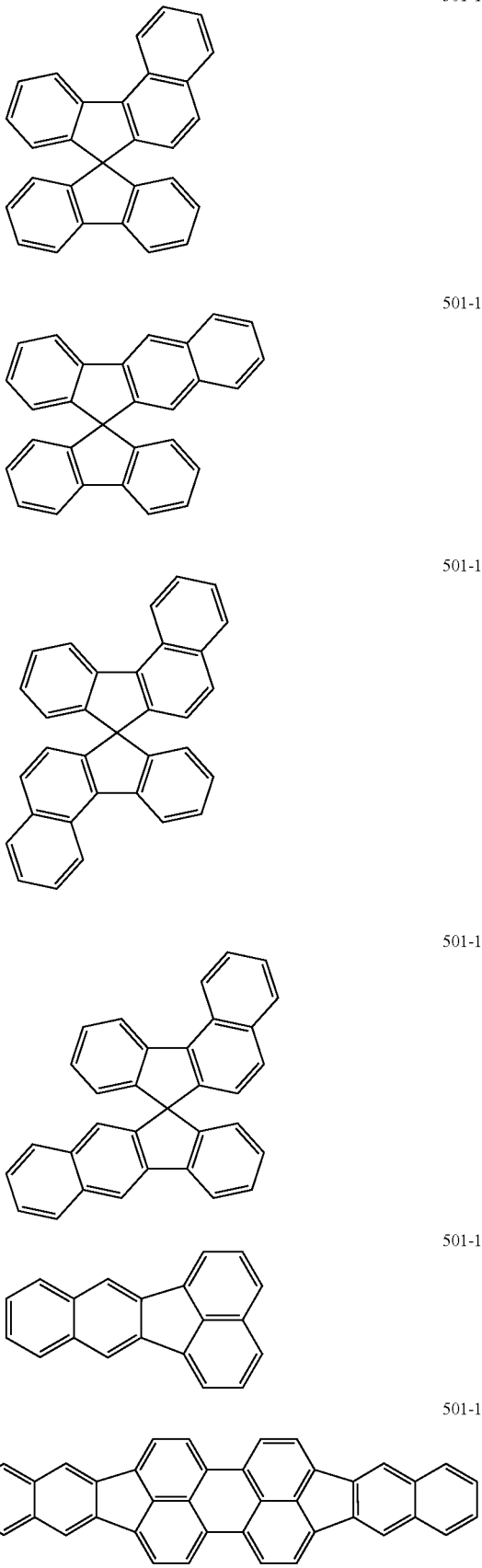

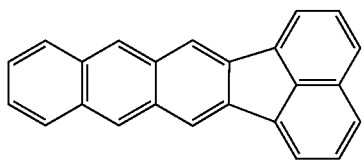

501-19

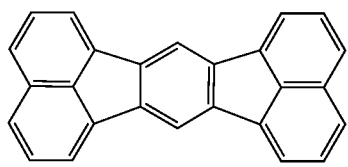

501-20

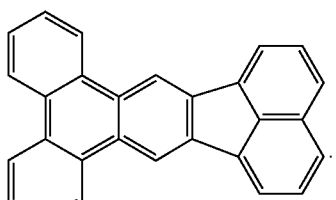

501-21

In one or more embodiments, the fluorescent dopant may include a compound represented by Formula 501 below:

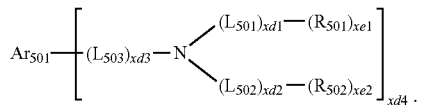

Formula 501

In Formula 501,

Ar$_{501}$ may be: a naphthalene, a fluorene, a spiro-bifluorene, a benzofluorene, a dibenzofluorene, a phenanthrene, an anthracene, a fluoranthene, a triphenylene, a pyrene, a chrysene, a naphthacene, a picene, a perylene, a pentaphene, an indenoanthracene, a tetracene, a bisanthracene, or a group represented by one of Formulae 501-1 to 501-21 above; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-21, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group and —Si($Q_{501}$)($Q_{502}$)($Q_{503}$) (wherein $Q_{501}$ to $Q_{503}$ may each independently be hydrogen, $C_1$-$C_{60}$ alkyl group, a Cr $C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group), or any combination thereof, $L_{501}$ to $L_{503}$ are each independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $R_{501}$ and $R_{502}$ are each independently:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof.

xd1 to xd3 may each independently be 0, 1, 2, 3, 4, or 5, xd4 may be 1, 2, 3, or 4, and xe1 and xe2 may each independently be 0, 1, 2, 3, 4, 5, 6, 7, or 8.

In one or more embodiments, the fluorescent emitter may include a compound represented by Formula 511 below:

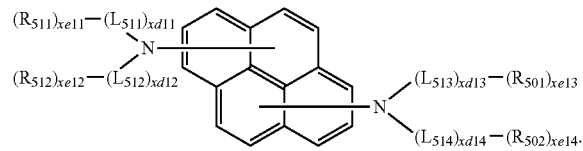

Formula 511

In Formula 511, $L_{511}$ to $L_{514}$ may each independently be the same as described in connection with $L_{501}$ to $L_{503}$, xd11 to xd14 may each independently be 1, 2, 3, 4, or 5, $R_{511}$ to $R_{514}$ may each independently be the same as described in connection with $R_{501}$ and $R_{502}$, and xe11 to xe14 may each independently be 0, 1, 2, 3, 4, 5, 6, 7, or 8.

In one or more embodiments, the fluorescent emitter may include at least one compound of, for example, Compounds FD(1) to FD(16) and FD1 to FD16 below:

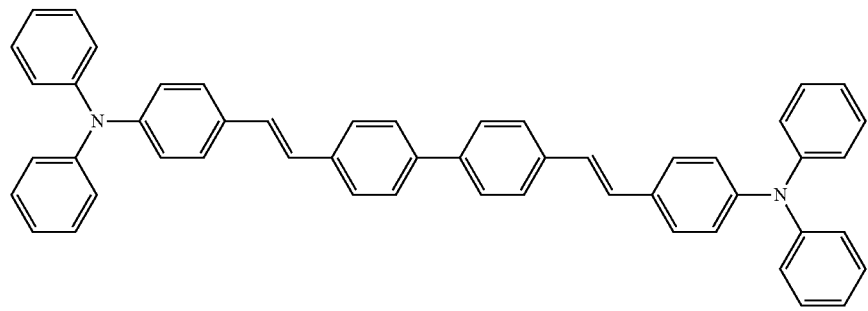

FD(1)

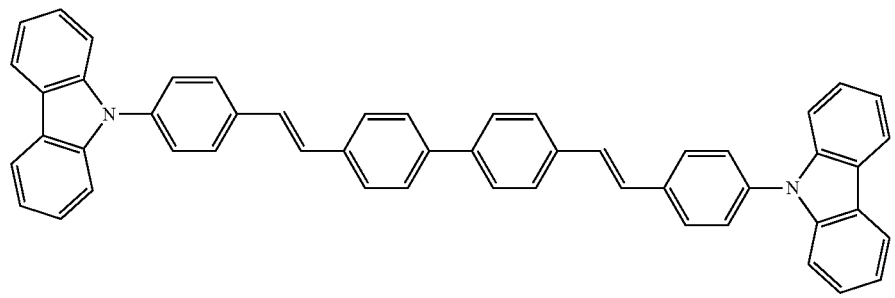

FD(2)

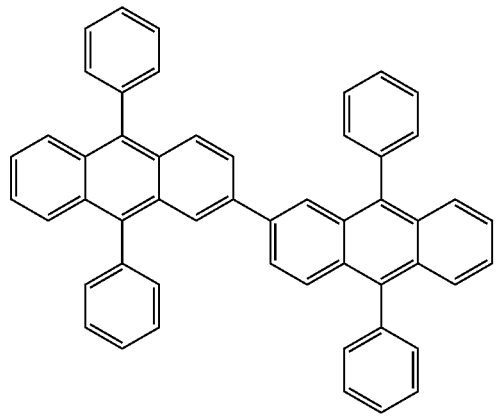

FD(3)

FD(4)
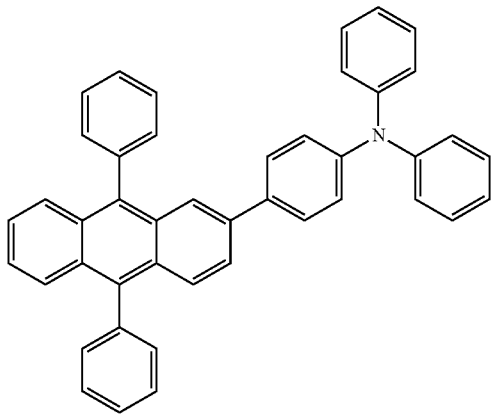
FD(5)
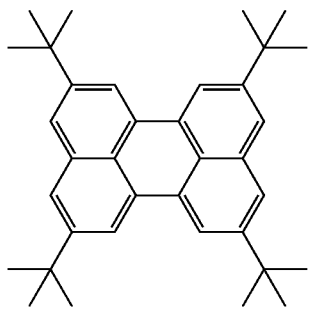
FD(6)
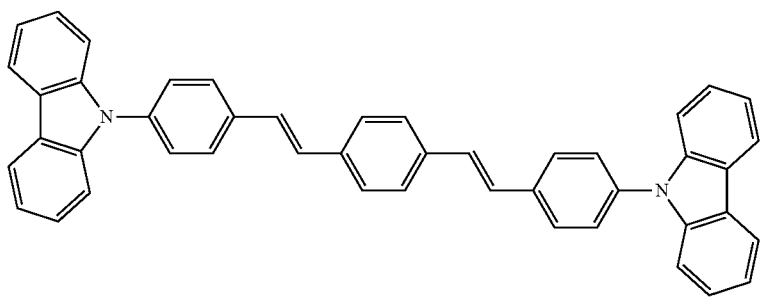
FD(7)
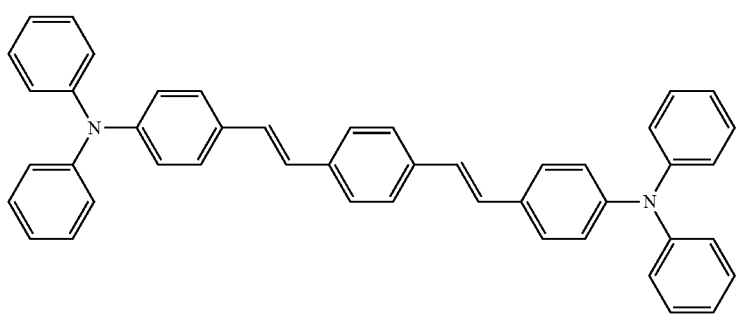
FD(8)
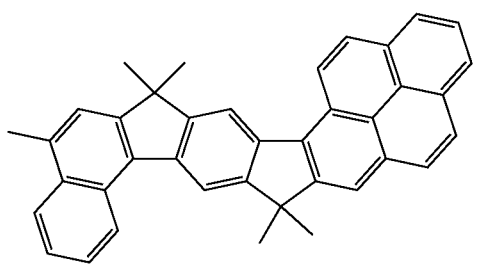

-continued
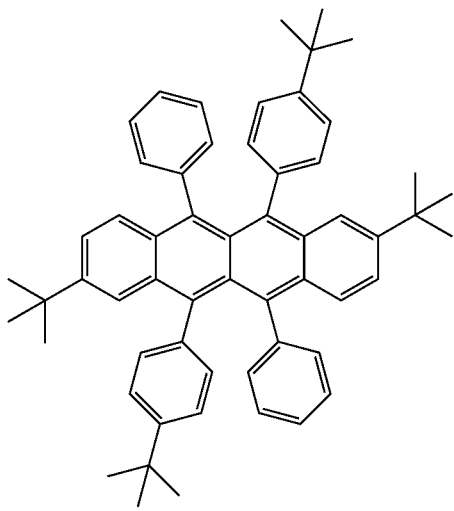
FD(9)
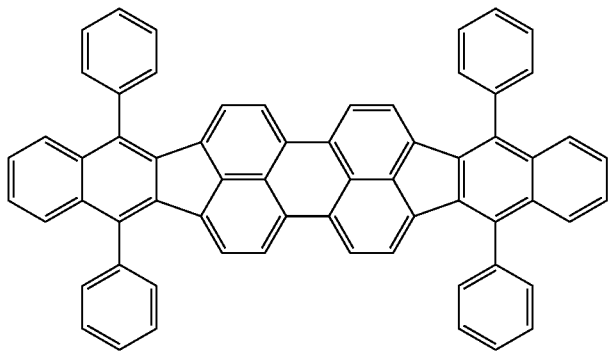
FD(10)
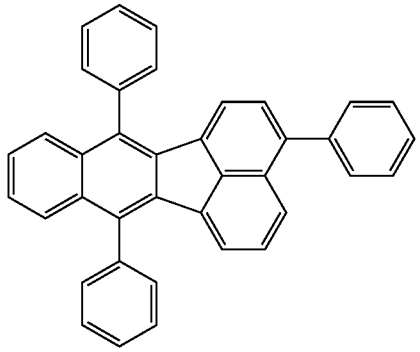
FD(11)
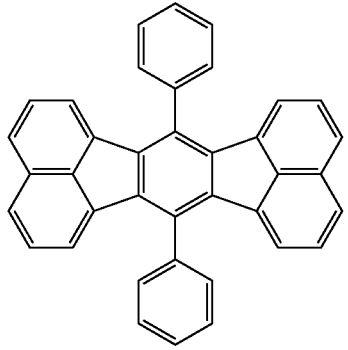
FD(12)

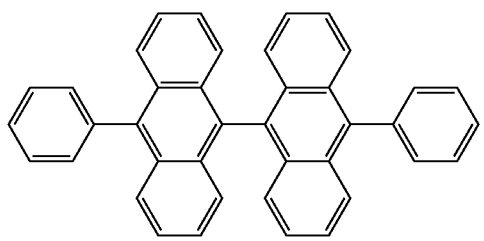
FD(13)
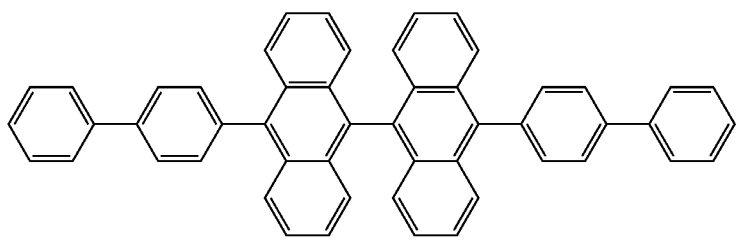
FD(14)
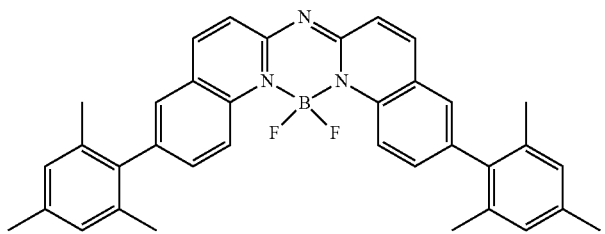
FD(15)
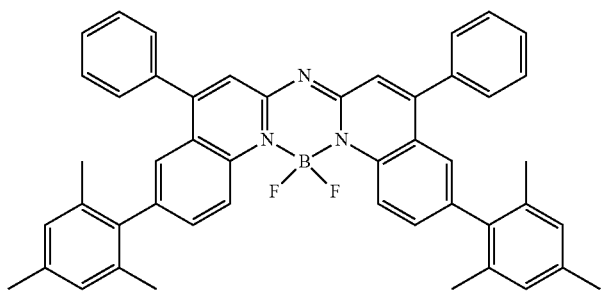
FD(16)
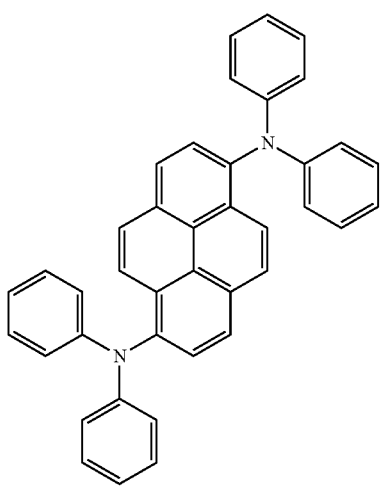
FD1

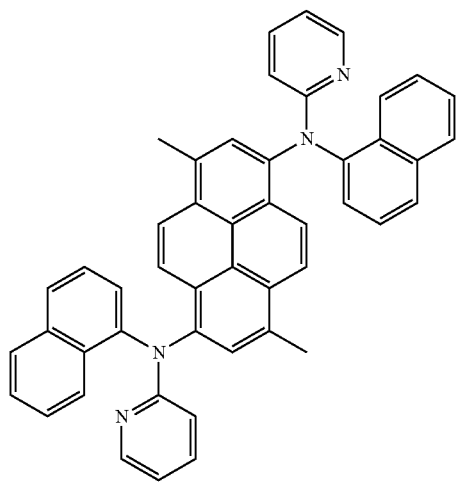
FD2
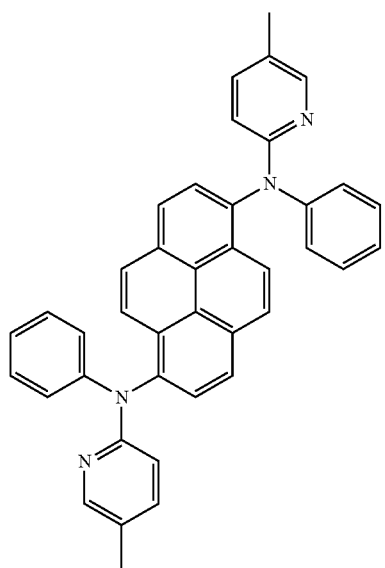
FD3

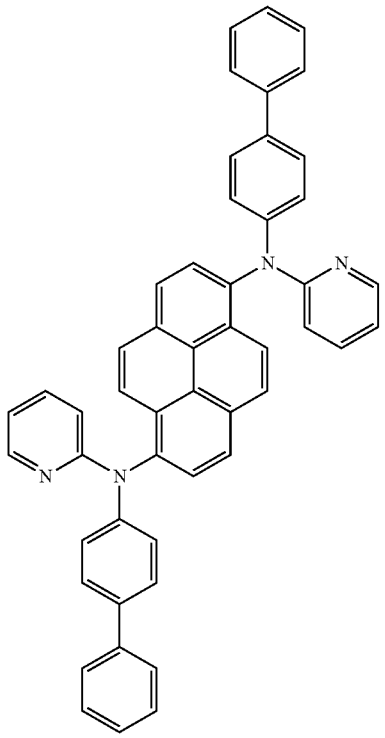
FD4
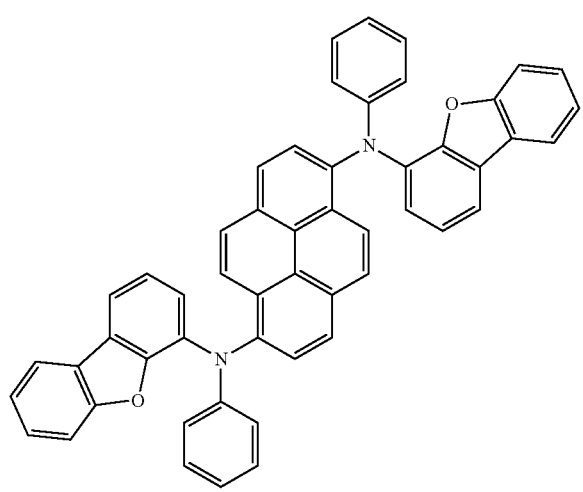
FD5

-continued
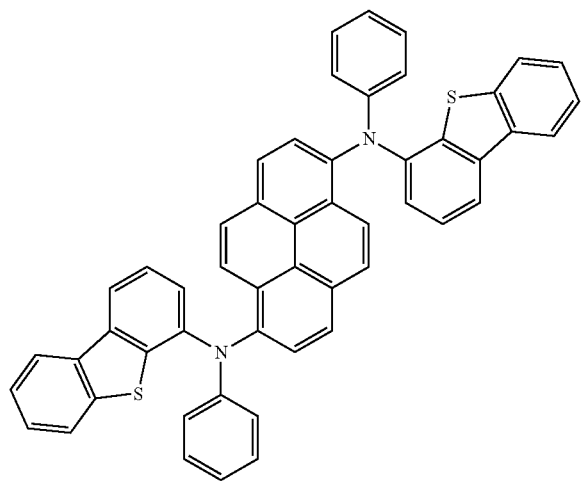
FD6
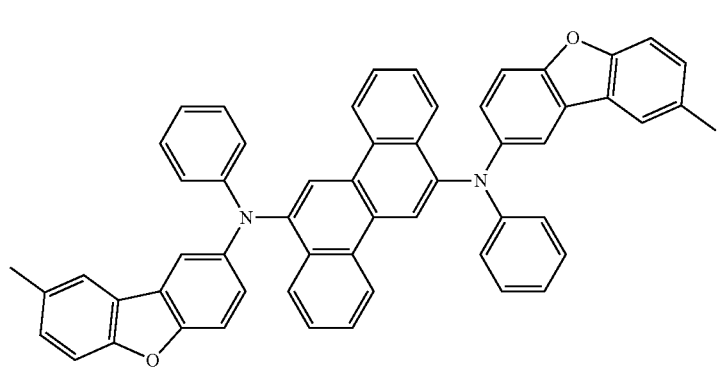
FD7
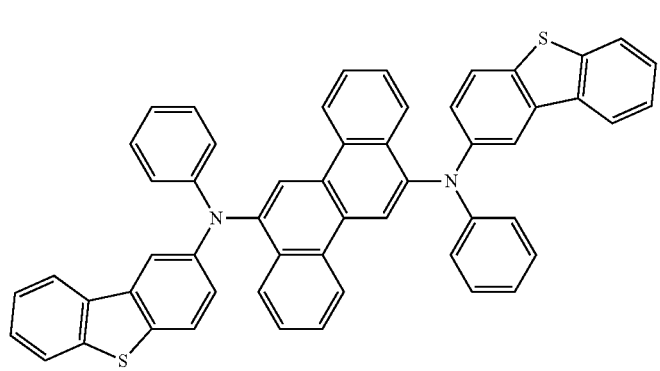
FD8
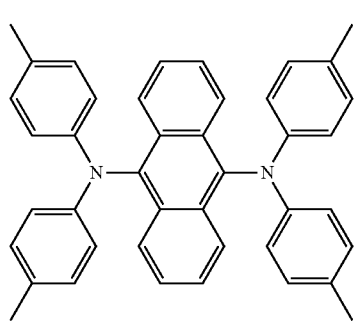
FD9

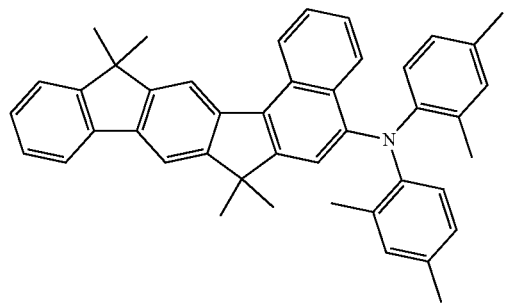
FD10
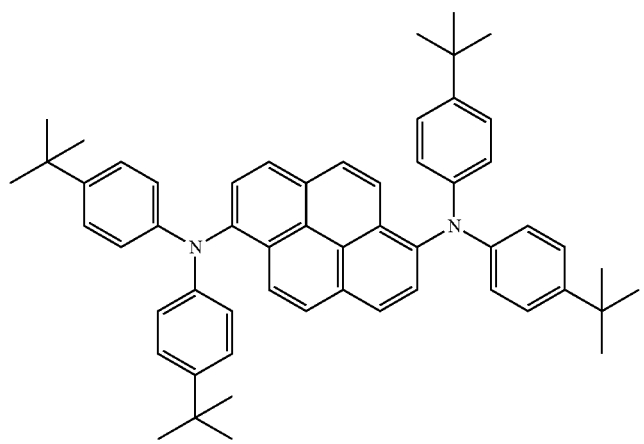
FD11
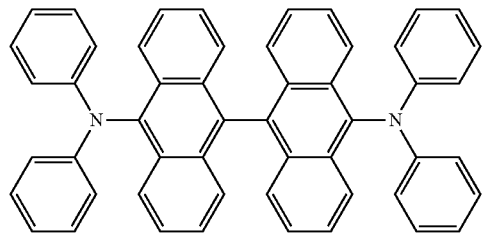
FD12
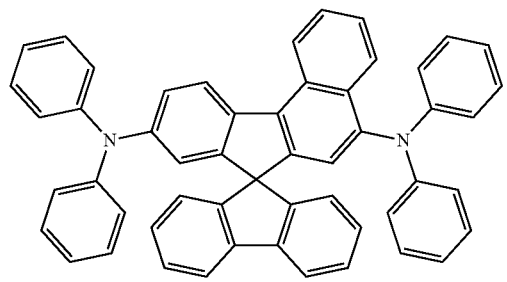
FD13
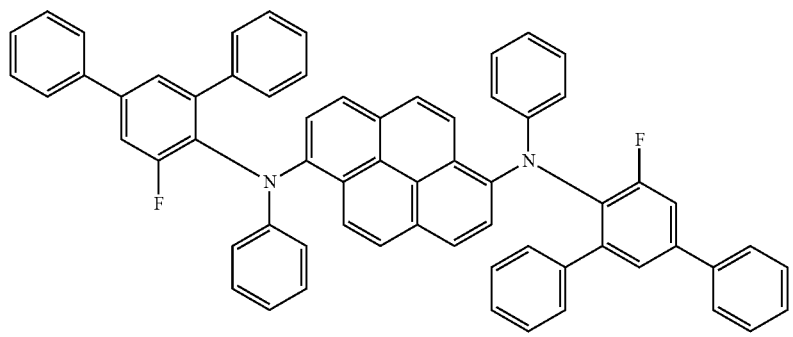
FD14

-continued

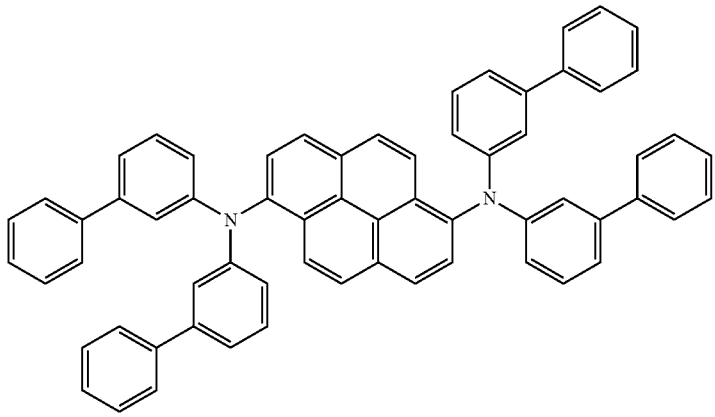

FD15

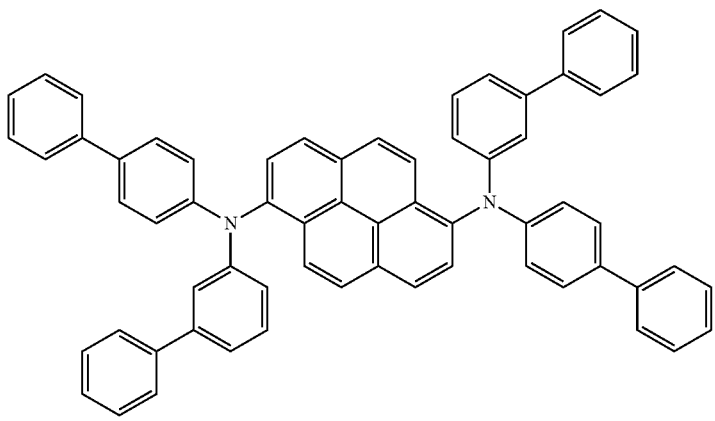

FD16

In one or more embodiments, the fluorescent emitter may satisfy Inequality 2 below:

$$|T1(FL)-S1(FL)|>0.2 \text{ eV}.$$  Inequality 2

In Inequality 2,
T1(FL) indicates a lowest excitation triplet energy level of the fluorescent emitter, and
S1(FL) indicates a lowest excitation singlet energy level of the fluorescent emitter.

That is, In one or more embodiments, the difference between the lowest excitation triplet energy level and the lowest excitation singlet energy level of the fluorescent emitter may be greater than about 0.2 eV, so that reverse intersystem crossing (RISC) may hardly occur.

That is, the fluorescent emitter satisfying Inequality 2 above may be clearly distinguished from a delayed fluorescence emitter (e.g., a thermally activated delayed fluorescence (TADF) emitter) in which delayed fluorescence is predominantly emitted as compared to prompt fluorescence. Here, the organic light-emitting device exhibits final emission by the fluorescent emitter which emits prompt fluorescence as described above, and in this regard, the emission layer may be able to emit prompt fluorescence having a relatively small FWHM and excellent color purity.

In one or more embodiments, a maximum luminescence wavelength in the luminescence spectrum of the fluorescent emitter may be in a range of about 410 nm to about 490 nm. For example, the maximum luminescence wavelength in the luminescence spectrum of the fluorescent emitter may be in a range of about 430 nm to about 475 nm.

In one or more embodiments, the emission layer may emit blue light having a maximum luminescence wavelength in a range of about 410 nm to about 490 nm. For example, the emission layer may emit deep blue light having a maximum luminescence wavelength in a range of about 430 nm to about 475 nm.

In one or more embodiments, a ratio of fluorescence-luminescent components released by the fluorescent emitter among the total luminescent components released by the emission layer may be 50% or more, 60% or more, 70% or more, 80% or more, or 90% or more. That is, the main luminescent components released by the emission layer may be fluorescence-luminescent components released by the fluorescent emitter.

In one or more embodiments, a ratio of luminescent components (e.g., phosphorescence-luminescent components) released by the sensitizer among the total luminescent components released by the emission layer may be less than 50%, less than 40%, less than 30%, less than 20%, or less than 10%. Thus, the fluorescent emitter included in the emission layer may substantially contribute to the luminescence of the emission layer.

The host may be any host. For example, the host may be the following examples:

In one or more embodiments, the host may have a triplet energy level of about 2.9 eV or more, for example, about 2.9 eV or more and about 4.5 eV or less. Thus, the energy transfer from the host to the sensitizer and the fluorescent emitter may be effectively achieved, and accordingly, the organic light-emitting device may have high efficiency.

In one or more embodiments, the host may be a single compound or a mixture of two or more different compounds.

For example, the host may include at least one of a fluorene-containing compound, a carbazole-containing compound, a dibenzofuran-containing compound, a dibenzothiophene-containing compound, an indenocarbazole-containing compound, an indolocarbazole-containing compound, a benzofurocarbazole-containing compound, a benzothienocarbazole-containing compound, an acridine-containing compound, a dihydroacridine-containing compound, a triindolobenzene-containing compound, pyridine-containing compound, a pyrimidine-containing compound, a triazine-containing compound, a silicon-containing compound, a cyano group-containing compound, a phosphine oxide-containing compound, a sulfoxide-containing compound, a sulfonyl-containing compound, or any combination thereof.

In one or more embodiments, the host may include a first material and a second material.

The first material may be a hole transport host not including an electron transport moiety, and the second material may be an electron transport host including at least one electron transport moiety.

For example, the first material may include at least one TT electron-deficient nitrogen-free cyclic group, and may not include the electron transport moiety; and the second material may include at least one TT electron-deficient nitrogen-free cyclic group and at least one electron transport moiety. Here, the electron transport moiety may be a cyano group, a TT electron-deficient nitrogen-containing cyclic group, or a group represented by one of the following Formulae:

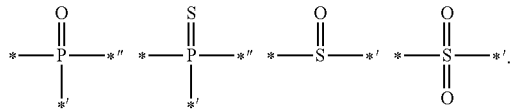

In the Formulae above, *, *', and *" each indicate a binding site to a neighboring atom.

In the present specification, the term "π electron-deficient nitrogen-containing ($C_1$-$C_{30}$) cyclic group" as used herein indicates a group, such as a $C_1$-$C_{30}$ cyclic group, having at least one *—N=*' moiety. Examples of the TT electron-deficient nitrogen-containing rings include an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, an isobenzoxazole group, a triazole group, a tetrazole group, an oxadiazole group, triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, an azadibenzosilole group, and a condensed cyclic group in which at least one of the group above is condensed with a cyclic group.

In the present specification, the term "TT electron-deficient nitrogen-free ($C_5$-$C_{30}$) cyclic group" indicates, for example, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, and a dihydroacridine group. For example, the TT electron-deficient nitrogen-free ($C_5$-$C_{30}$) cyclic group may have 5 to 30 carbon atoms.

The host may include at least one of TPBi, TBADN, ADN (also referred to as "DNA"), CBP, CDBP, TCP, mCP, Compound H50, Compound H51, or any combination thereof:

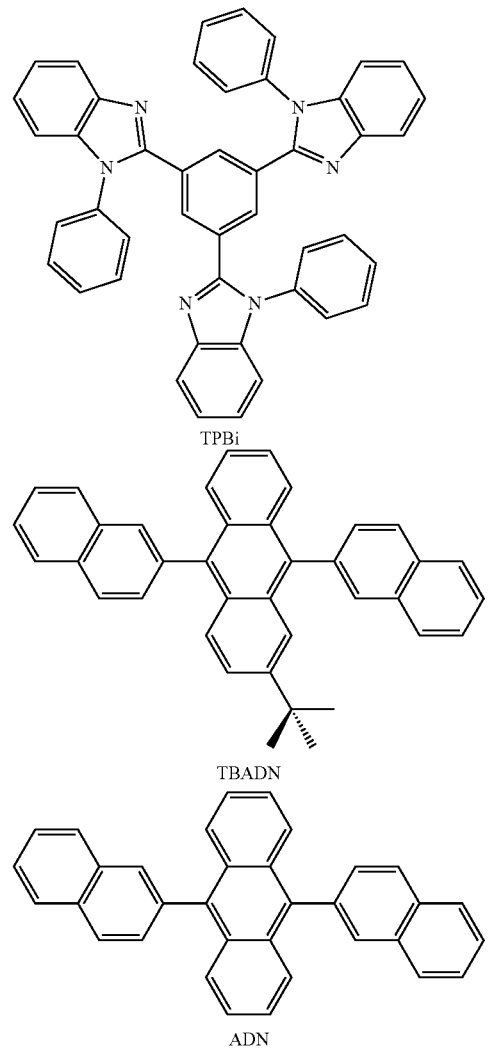

TPBi

TBADN

ADN

In one or more embodiments, the host may further include a compound represented by Formula 301 below:

Formula 301

$$Ar_{114}-(Ar_{112})_h\text{-anthracene-}(Ar_{111})_g-Ar_{113}$$

with $(Ar_{115})_i$ and $(Ar_{116})_j$ substituents on the anthracene.

In Formula 301, $Ar_{111}$ and $Ar_{112}$ may each independently be:
- a phenylene group, a naphthylene group, a phenanthrenylene group, or a pyrenylene group; or
- a phenylene group, a naphthylene group, a phenanthrenylene group, or a pyrenylene group, each substituted with at least one a phenyl group, a naphthyl group, an anthracenyl group, or any combination thereof.

In Formula 301, Arm to Arm may each independently be:
- a $C_1$-$C_{10}$ alkyl group, a phenyl group, a naphthyl group, a phenanthrenyl group, or a pyrenyl group; and
- a phenyl group, a naphthyl group, a phenanthrenyl group, or a pyrenyl group, each substituted with at least one a phenyl group, a naphthyl group, an anthracenyl group, or any combination thereof.

In Formula 301, g, h, i, and j may each independently be an integer from 0 to 4, and may be, for example, 0, 1, or 2.

In Formula 301, Arm to Arm may each independently be:
- a $C_1$-$C_{10}$ alkyl group substituted with at least one a phenyl group, a naphthyl group, or an anthracenyl group;
- a phenyl group, a naphthyl group, an anthracenyl group, a pyrenyl, a phenanthrenyl group, or a fluorenyl group;
- a phenyl group, a naphthyl group, an anthracenyl group, a pyrenyl group, a phenanthrenyl group, or a fluorenyl group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or any combination thereof; or but embodiments of the present disclosure are not limited thereto.

In one or more embodiments, the host may include a compound represented by Formula 302 below:

Formula 302

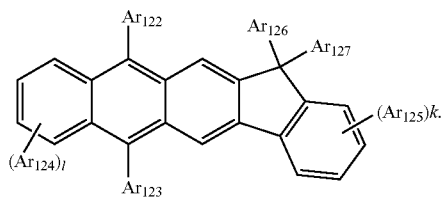

In Formula 302, $Ar_{122}$ to $Ar_{125}$ may be the same as described in connection with Arm in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may be 0, 1, or 2.

In one or more embodiments, the host may be at least one of Compounds H1 to Compounds H32 below:

H1

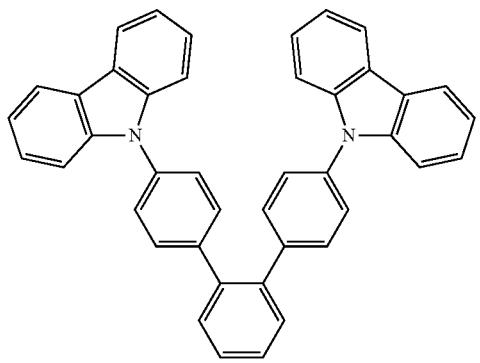

H2

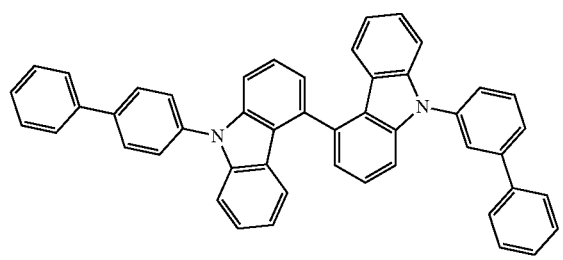

H3

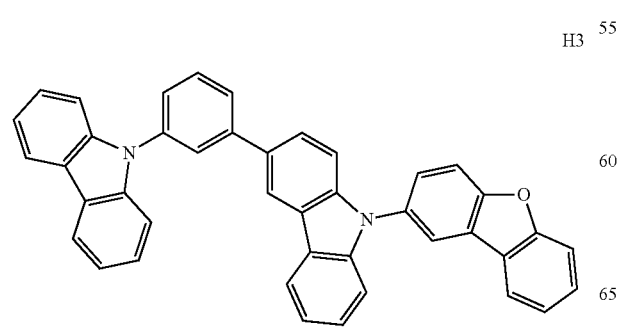

H4

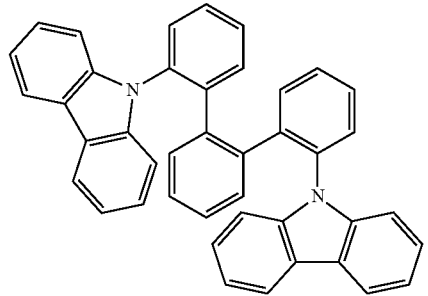

H5

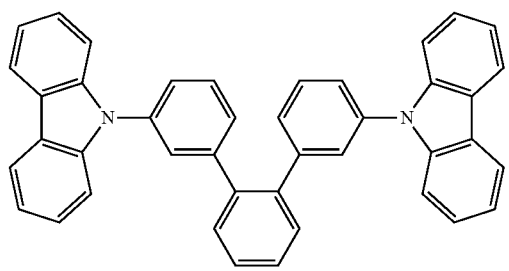

H6

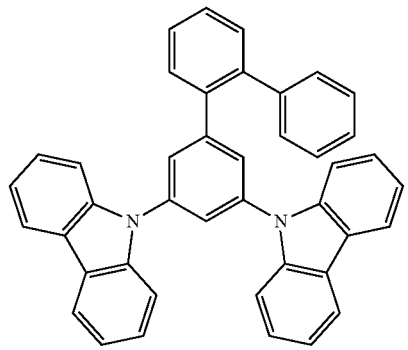

H7

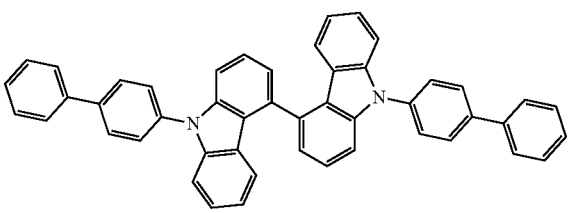

H8

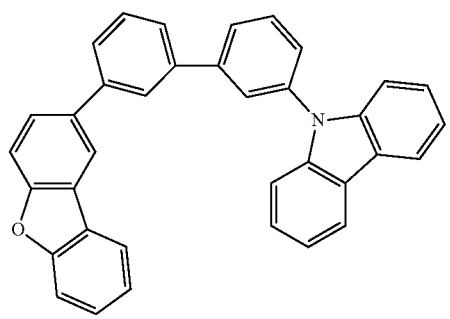

-continued
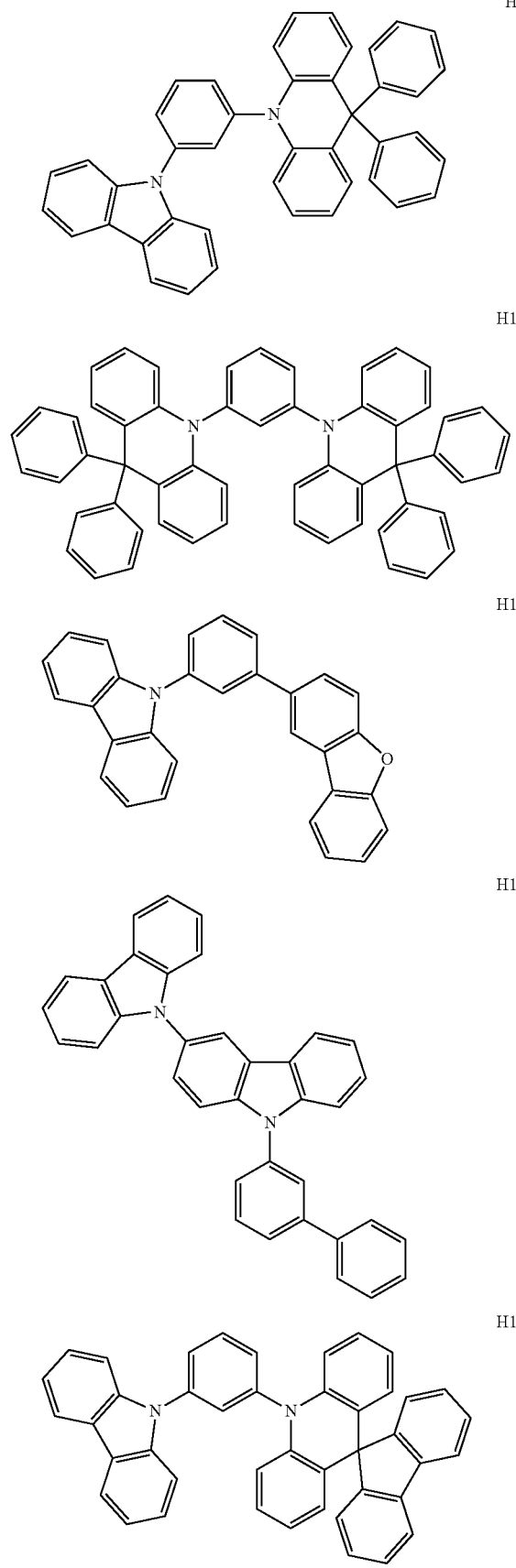
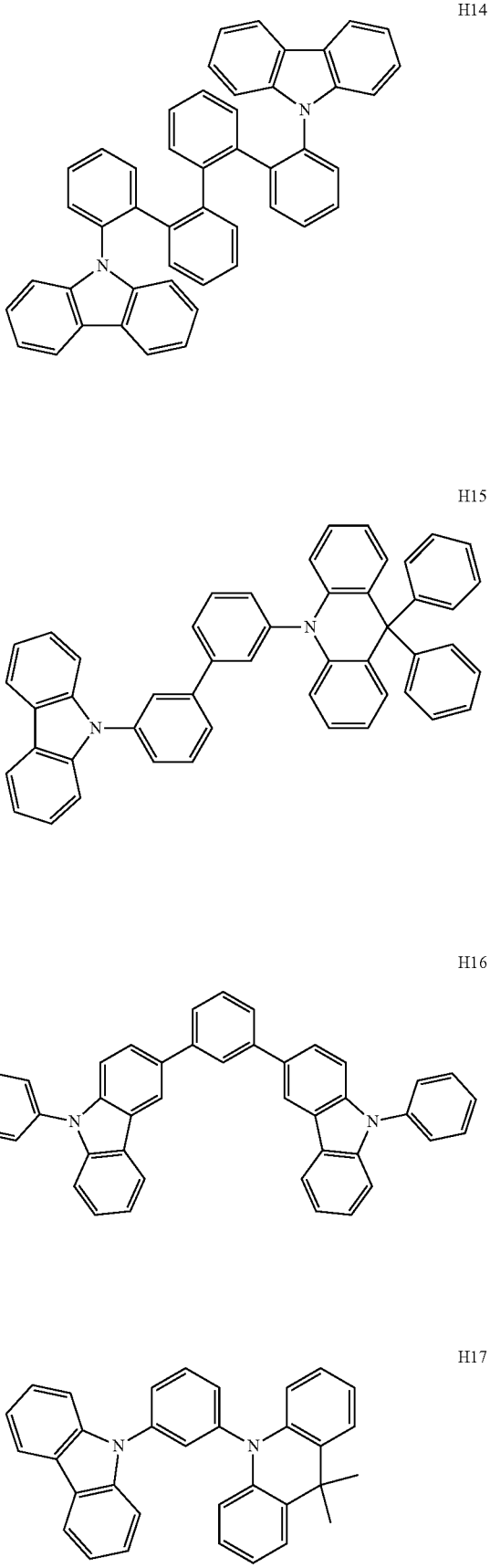

H18
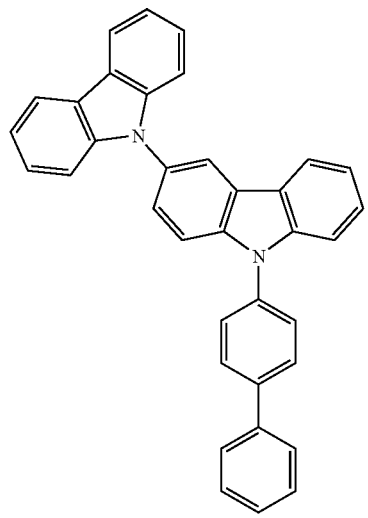
H19
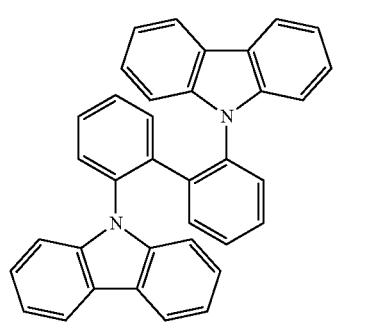
H20
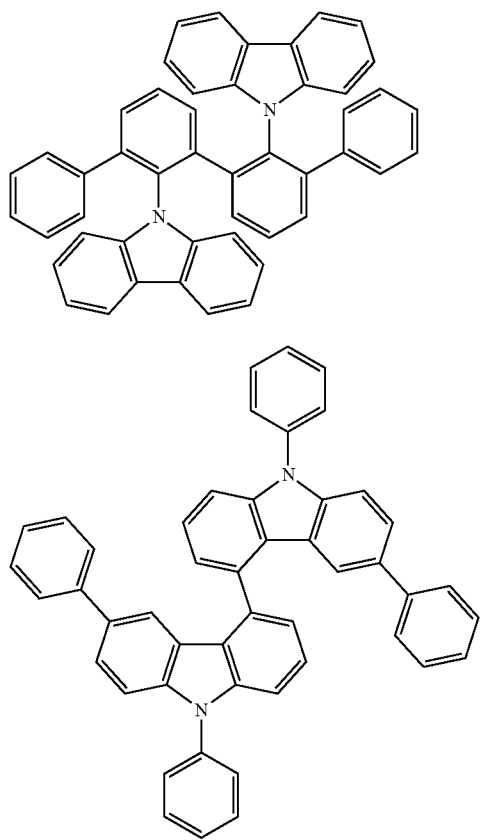
H21
H22
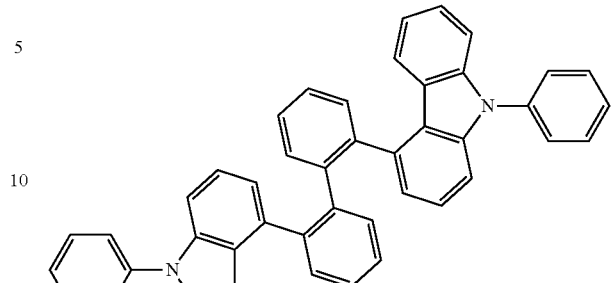
H23
H24
H25
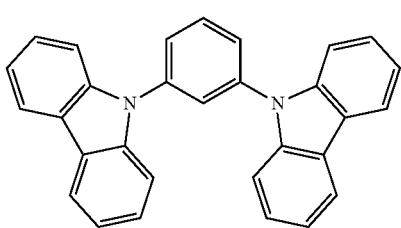

H26
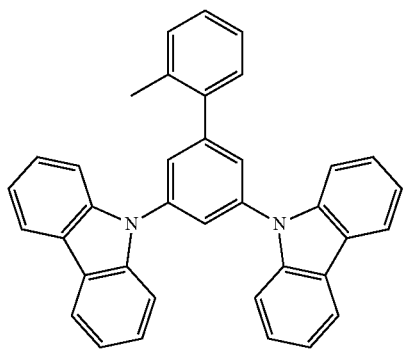

H27
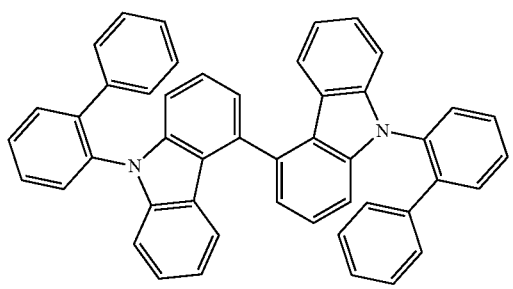

H28
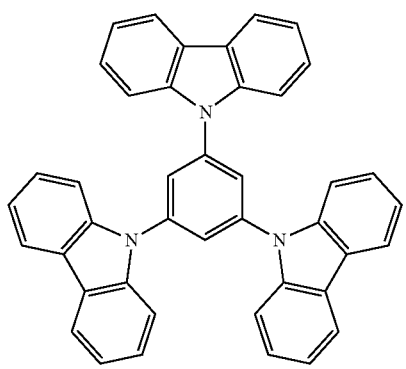

H29
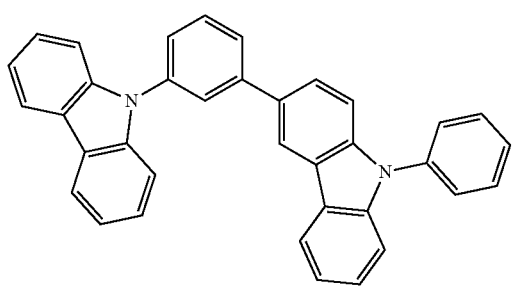

H30
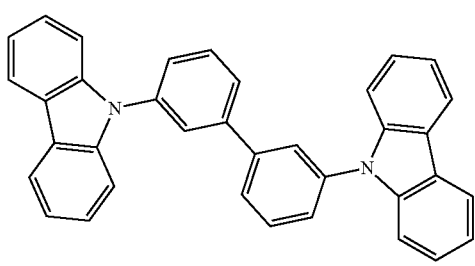

H31
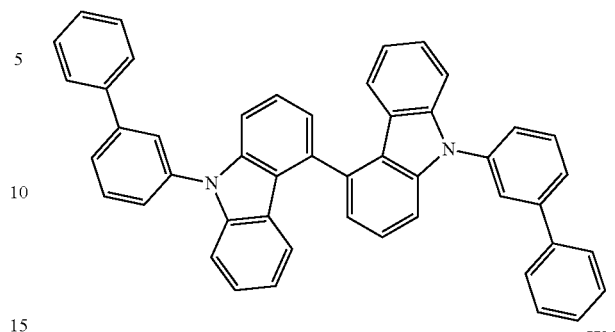

H32
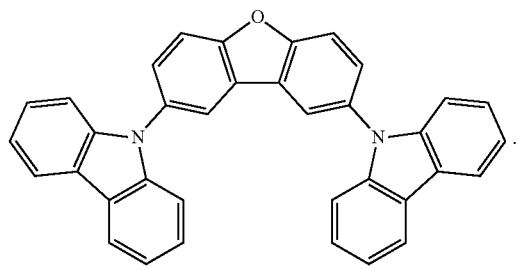

In one or more embodiments, the host consists of a single compound. In one or more embodiments, such a single compound may be the first material (e.g., a hole transport host) and the second material (e.g., an electron transport host).

In one or more embodiments, the host consists of two different compounds. In one or more embodiments, such two different compounds consist of the first material (e.g., a hole transport host) and the second material (e.g., an electron transport host).

In one or more embodiments, the organic light-emitting device may further satisfy Inequality 3 below:

$$T1(HOST)-T1(SE) > 0.05 \text{ eV}.$$  Inequality 3

In Inequality 3,
T1(HOST) indicates the lowest excitation triplet energy level (eV) of the host, and
T1(SE) indicates the lowest excitation triplet energy level (eV) of the sensitizer.

In one or more embodiments, when the organic light-emitting device further satisfies Inequality 3 above, the probability of transferring the triplet exciton energy generated in the sensitizer included in the emission layer to the host included in the emission layer may be decreased, so that the rate at which the triplet excitons are lost in pathways other than through luminescence may be reduced. Accordingly, the organic light-emitting device may have high efficiency.

In one or more embodiments, in the organic layer, an amount of the sensitizer may be greater than that of the fluorescent emitter. For example, a volume ratio of the sensitizer to the fluorescent emitter may be in a range of about 30:0.1 to about 10:3 or about 10:0.1 to about 20:5. In one or more embodiments, a weight ratio of the sensitizer to the fluorescent emitter may be in a range of about 10:0.1 to about 20:5. In one or more embodiments, a volume ratio of the host to the sensitizer may be in a range of about 60:40 to about 95:5 to about 70:30 to 90:10. In one or more embodiments, a weight ratio of the host to the sensitizer may be in a range of about 60:40 to about 95:5. When the amounts of the sensitizer, the fluorescent emitter, and the host are satisfied within the ranges above, the organic light-emitting device may have improved luminescence efficiency and/or improved lifespan characteristics.

FIG. 1 is a schematic cross-sectional view of an organic light-emitting device 10 according to an exemplary embodiment. Hereinafter, the structure of an organic light-emitting device according to an embodiment of the present disclosure and a method of manufacturing an organic light-emitting device according to an embodiment of the present disclosure will be described in connection with FIG. 1. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include at least one of a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed by spin coating, the coating conditions may vary according to a material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one of m-MTDATA, TDATA, 2-TNATA, NPB, p-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

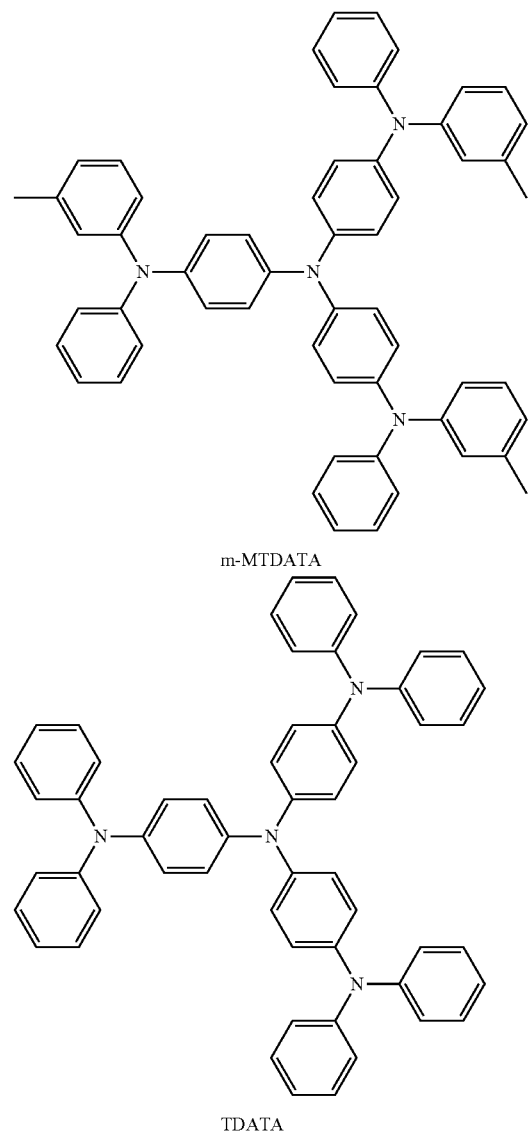

m-MTDATA

TDATA

-continued
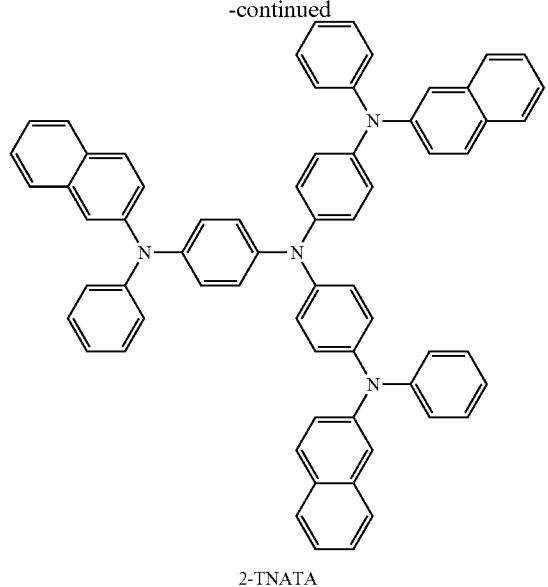
2-TNATA
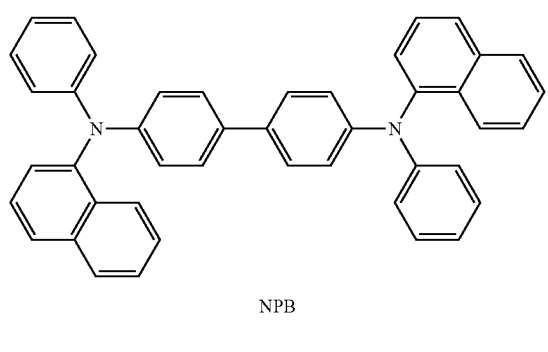
NPB
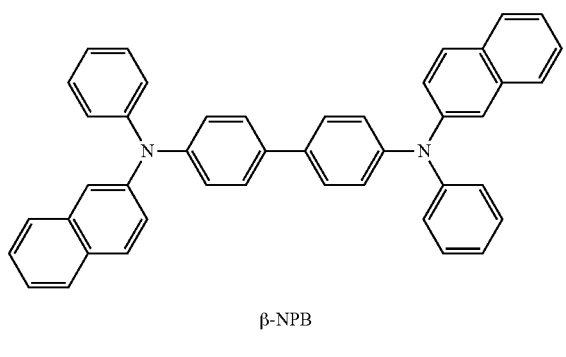
β-NPB
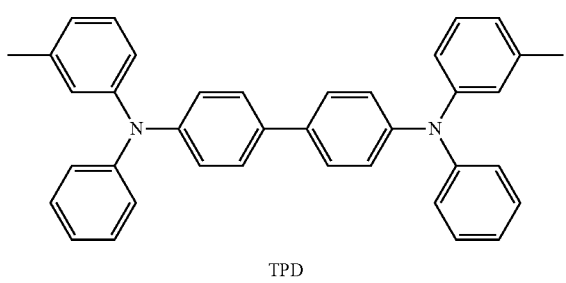
TPD
-continued
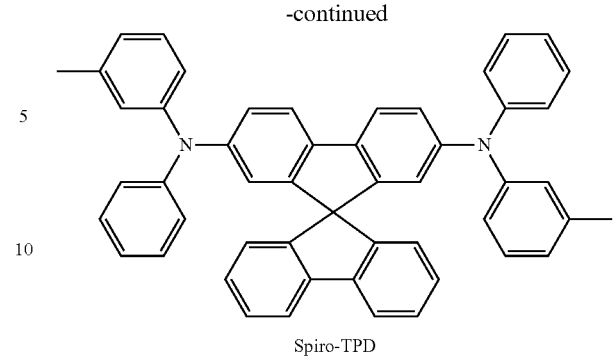
Spiro-TPD
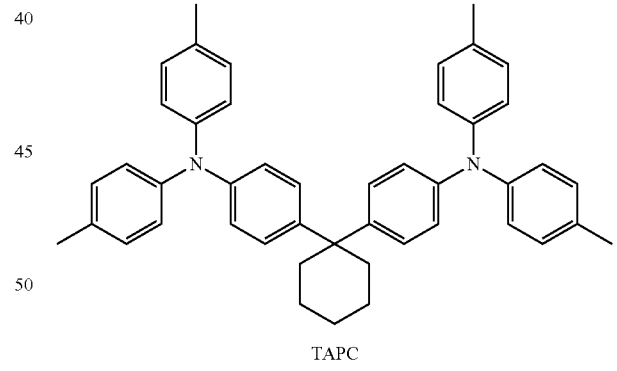
Spiro-NPB
methylated NPB
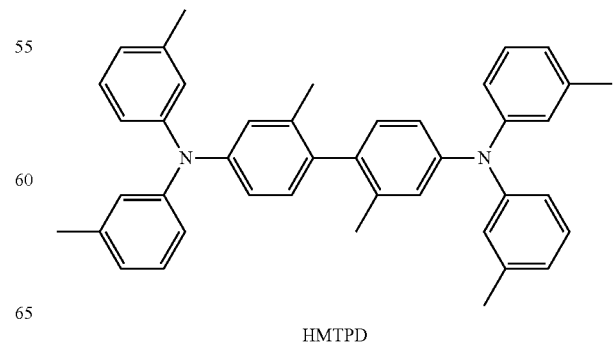
TAPC
HMTPD Formula 201

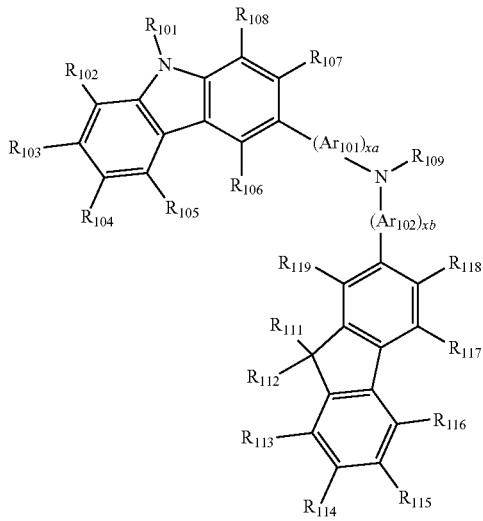

Formula 202

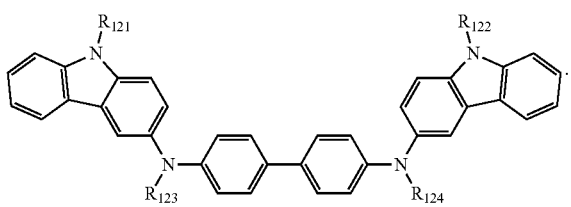

In Formula 201, $Ar_{101}$ and $Ar_{102}$ may each independently be:
- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or
- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a Cr $C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or may be 0, 1, or 2. For example, xa may be 1 and xb may be 0, but xa and xb are not limited thereto.

In Formula 201 and 202, $R_{101}$ to $R_{108}$, $R_{111}$ to $R_{119}$, and $R_{121}$ to $R_{124}$ may each independently be:

- hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.,) or a $C_1$-$C_{10}$ alkoxy group (for example, a methoxy group, an ethoxy group, a propoxy group, a butoxy group, a pentoxy group, etc.);
- a $C_1$-$C_{10}$ alkyl group or a $C_1$-$C_{10}$ alkoxy group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof;
- a phenyl group, a naphthyl group, an anthracenyl group, a fluorenyl group, or a pyrenyl group; or
- a phenyl group, a naphthyl group, an anthracenyl group, a fluorenyl group, or a pyrenyl group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a Cr $C_{10}$ alkyl group, a $C_1$-$C_{10}$ alkoxy group, or any combination thereof;
- but embodiments of the present disclosure are not limited thereto.

In Formula 201, $R_{109}$ may be:
- a phenyl group, a naphthyl group, an anthracenyl group, or a pyridinyl group; and
- a phenyl group, a naphthyl group, an anthracenyl group, or a pyridinyl group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A below, but embodiments of the present disclosure are not limited thereto:

Formula 201A
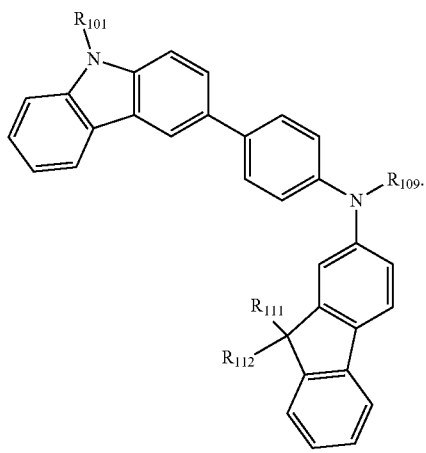
In Formula 201A, $R_{101}$, $R_{112}$, and $R_{109}$ may be the same as described above.
For example, the compound represented by Formula 201 and the compound represented by Formula 202 may include Compounds HT1 to HT20 below, but embodiments of the present disclosure are not limited thereto:
HT1
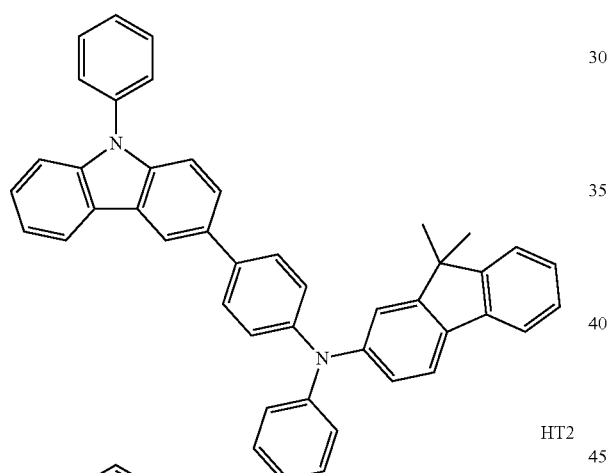
HT2
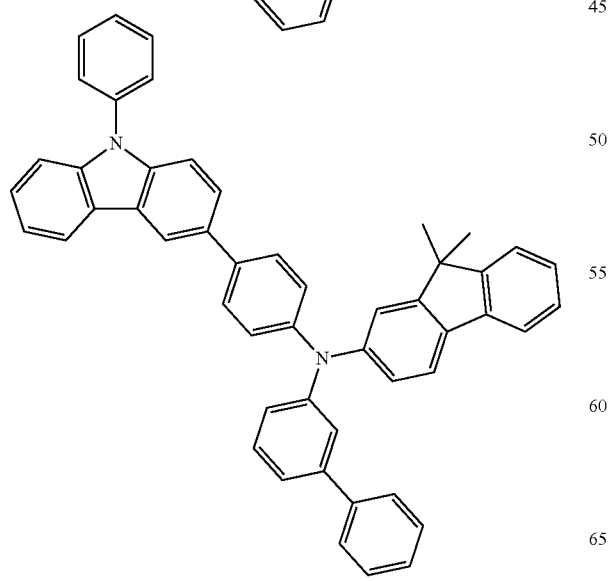
HT3
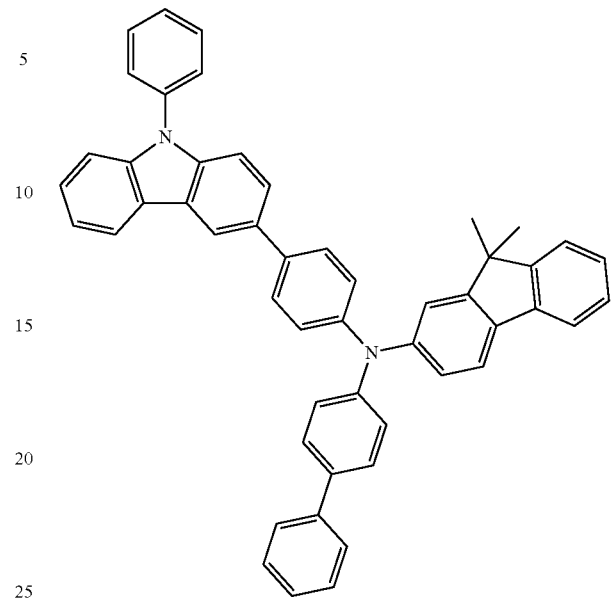
HT4
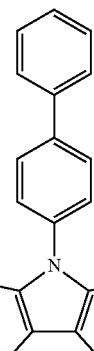

HT5
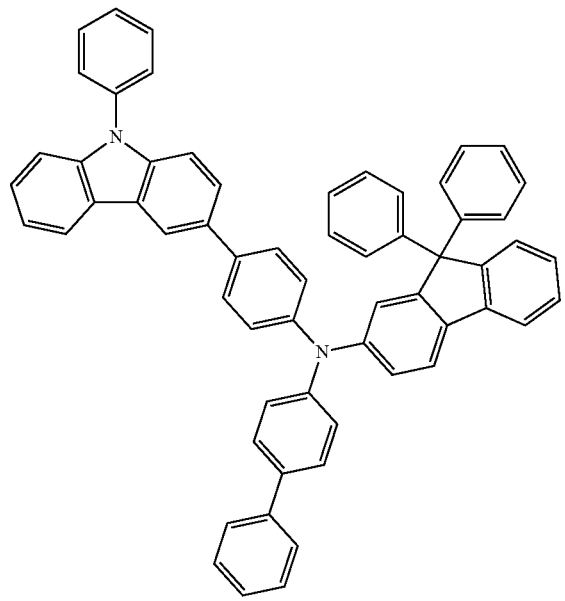
HT7
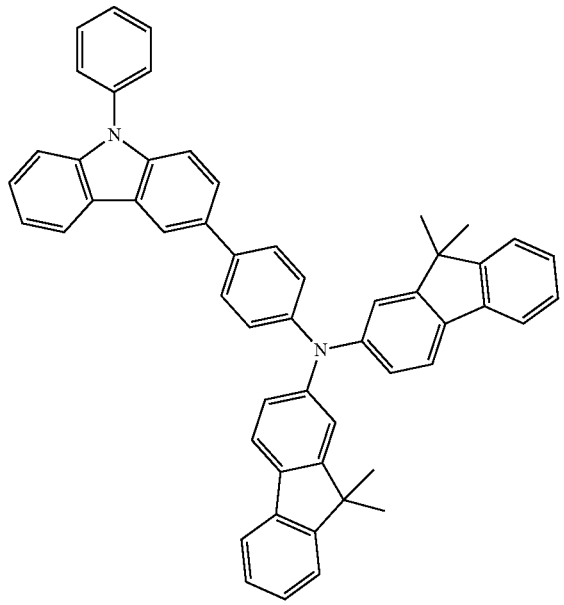
HT8
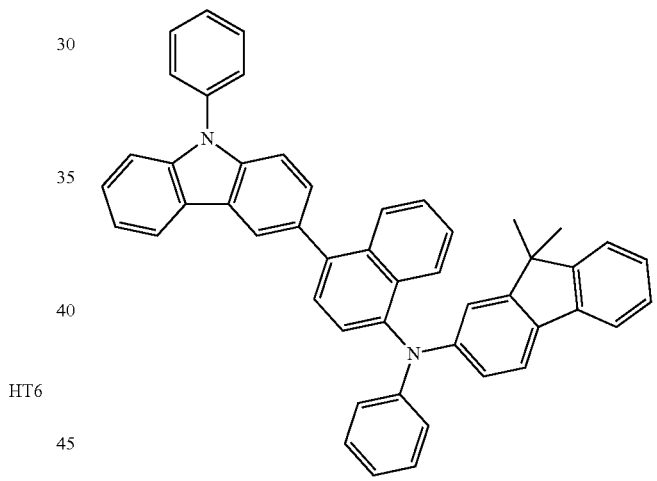
HT6
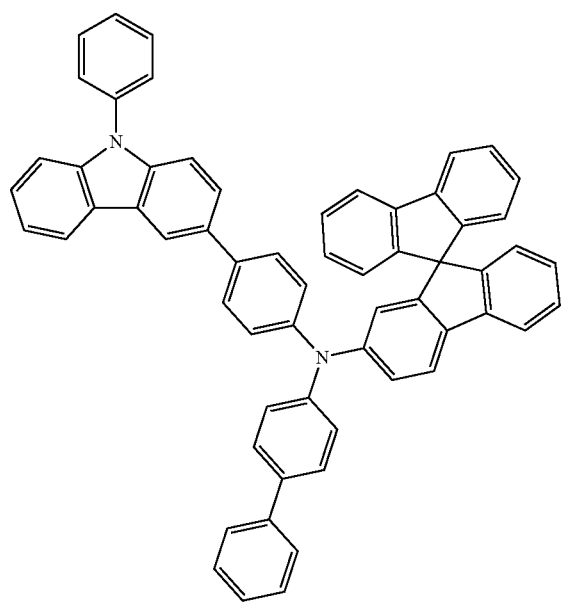
HT9
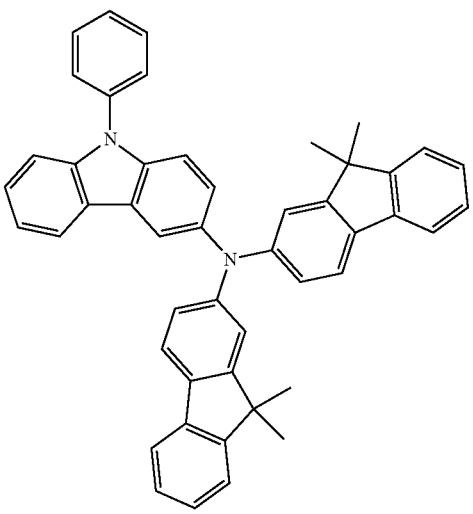

HT10
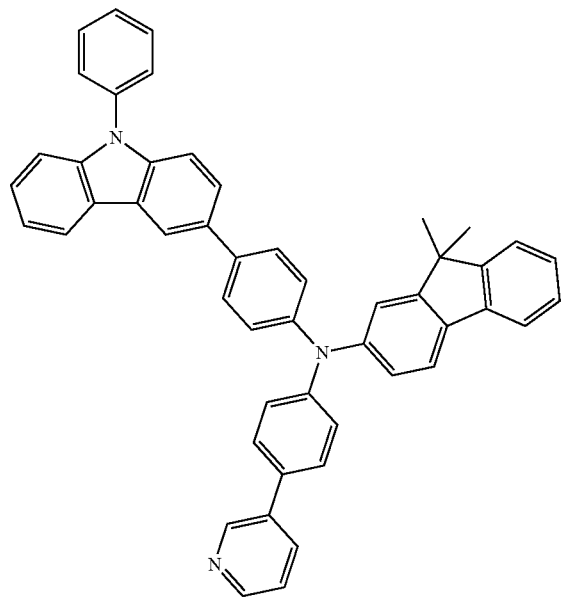
HT11
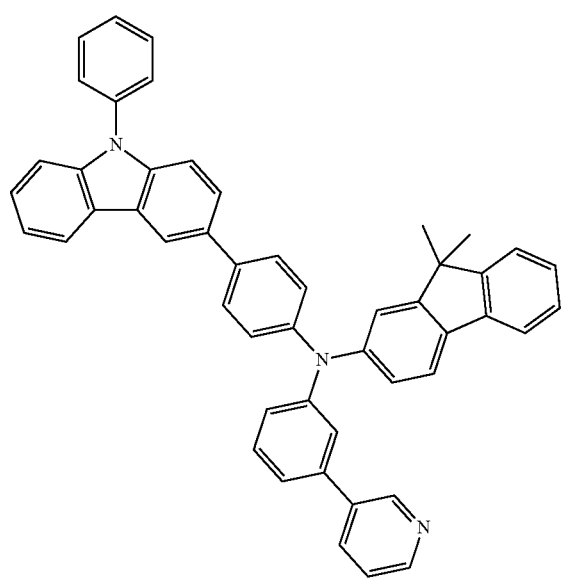
HT12
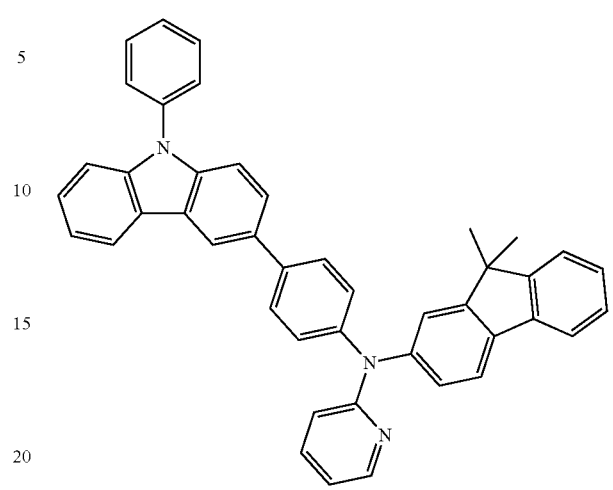
HT13
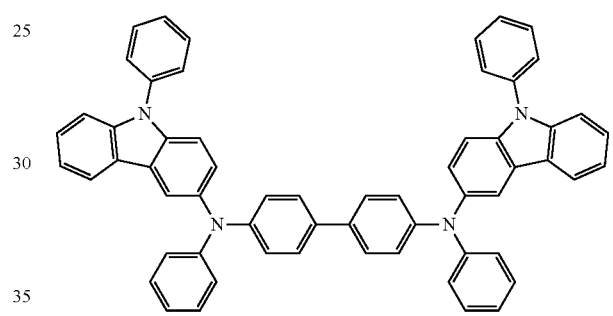
HT14
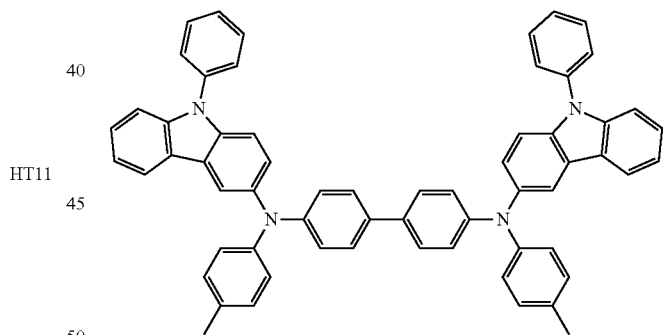
HT15
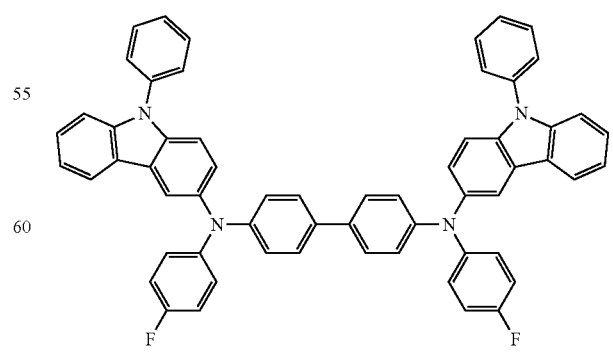

-continued

HT16
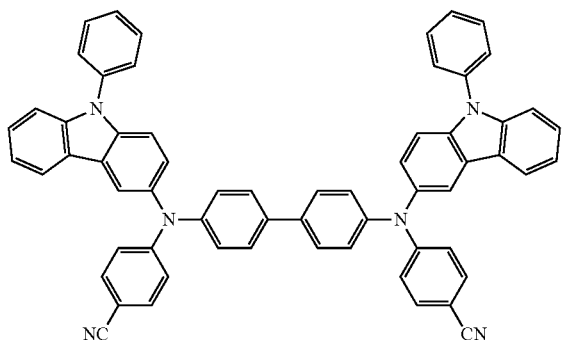

HT17
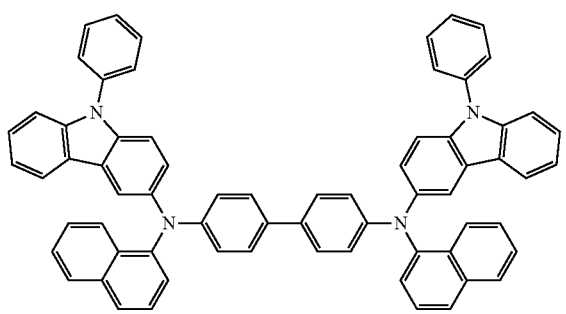

HT18

HT19
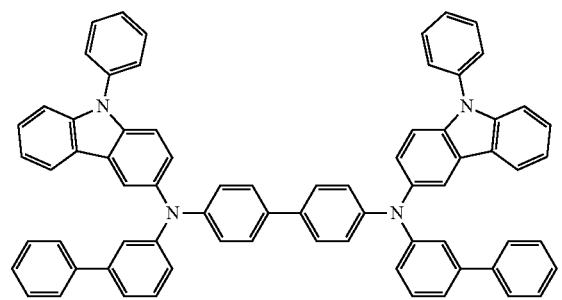

-continued

HT20
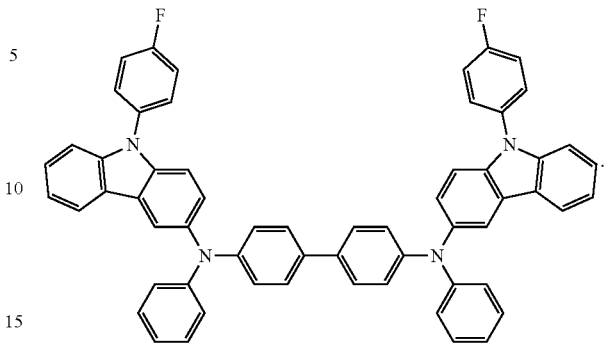

A thickness of the hole transport region may be in a range of about 100 Å to about 10,000 Å, for example, about 100 Å to about 1,000 Å. When the hole transport region includes both a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, a cyano group-containing compound, or any combination thereof, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 or Compound HT-D2 below, but are not limited thereto.

HT-D1
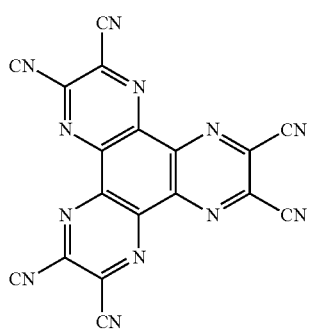

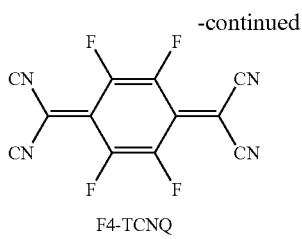

F4-TCNQ

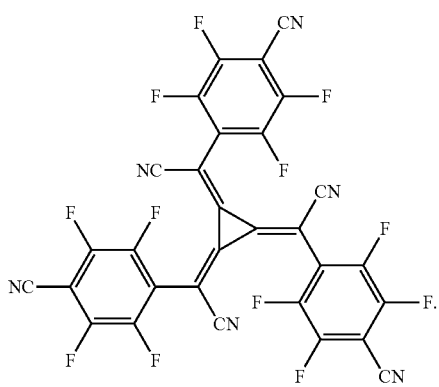

HT-D2

The hole transport region may further include a buffer layer.

The buffer layer may compensate for an optical resonance distance according to a wavelength of light emitted from the emission layer, and thus, efficiency of a formed organic light-emitting device may be improved.

The hole transport region may further include an electron blocking layer. The electron blocking layer may include a material available in the art, for example, mCP, but embodiments of the present disclosure are not limited:

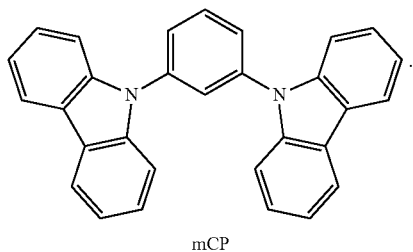 [SMILES: c1cc(-n2c3ccccc3c3ccccc32)cc(-n2c3ccccc3c3ccccc32)c1]

mCP

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

The emission layer may include a sensitizer, a fluorescent emitter, and a host as described in the present specification, and detailed descriptions thereof may be the same as described in the present specification.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include at least one a hole blocking layer, an electron transport layer, an electron injection layer, or any combination thereof.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP and Bphen, but embodiments of the present disclosure are not limited thereto:

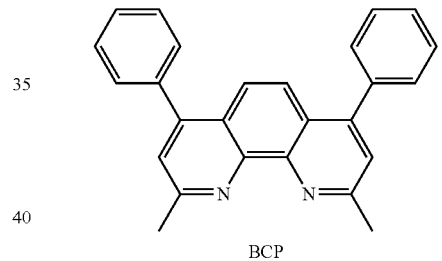

BCP

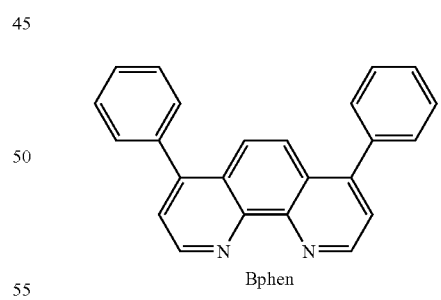

Bphen

In one or more embodiments, the hole blocking layer may include a compound the hosts above.

A thickness of the hole blocking layer may be in a range of about 20 Å to about 1,000 Å, for example, about 30 Å to about 300 Å. When the thickness of the hole blocking layer is within these ranges, excellent hole blocking characteristics may be obtained without a substantial increase in driving voltage.

The electron transport layer may include at least one BCP, Bphen, Alq$_3$, BAlq, TAZ, and NTAZ:

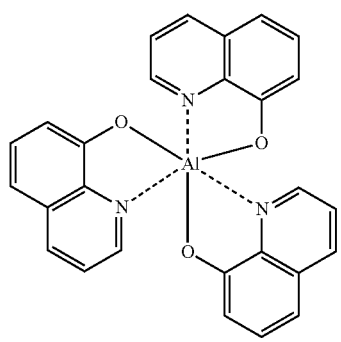
Alq₃
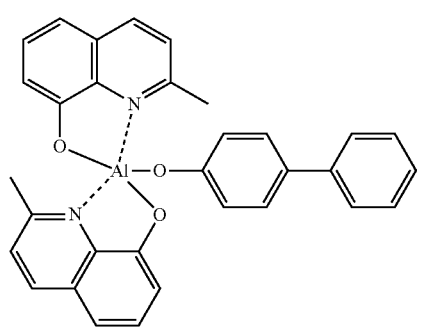
BAlq
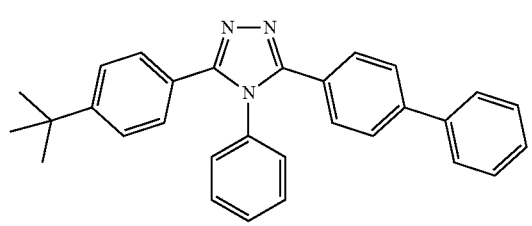
TAZ
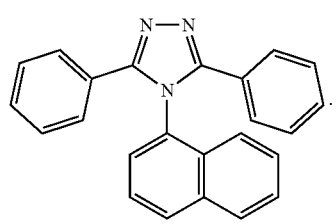
NTAZ
In one or more embodiments, the electron transport layer may include at least one of Compounds ET1 to Compounds ET25 below, but embodiments of the present disclosure are not limited thereto:
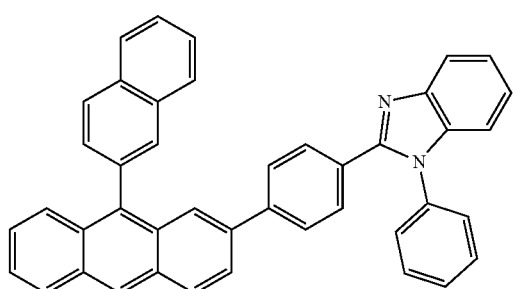
ET1
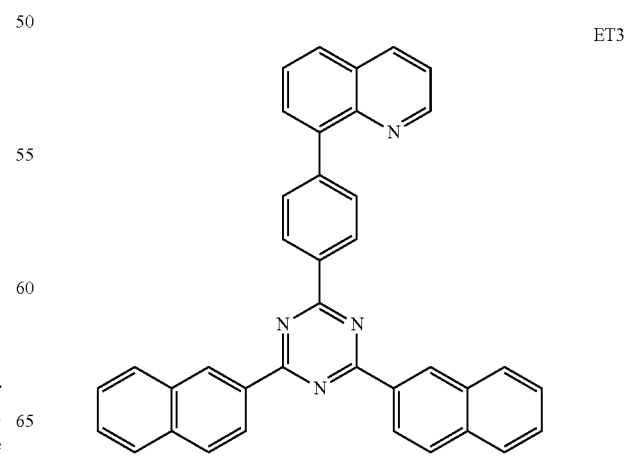
ET2
ET3

ET4
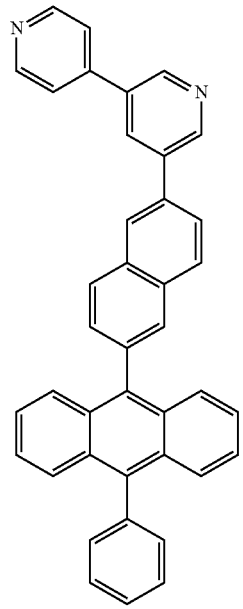
ET5
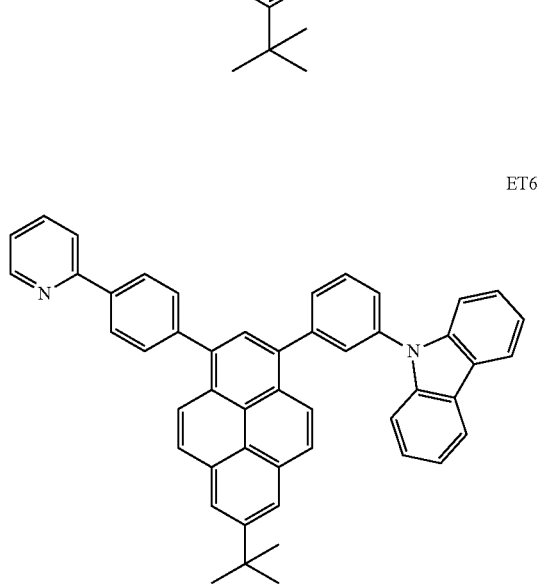
ET6
ET7
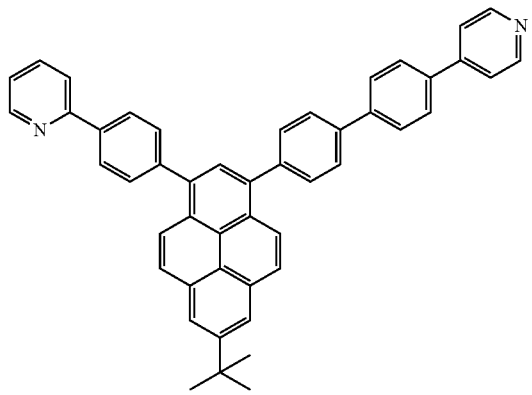
ET8
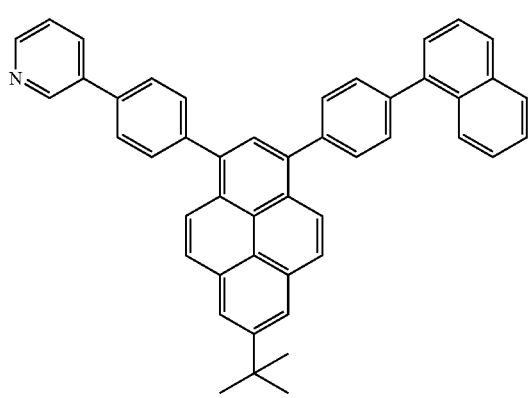
ET9
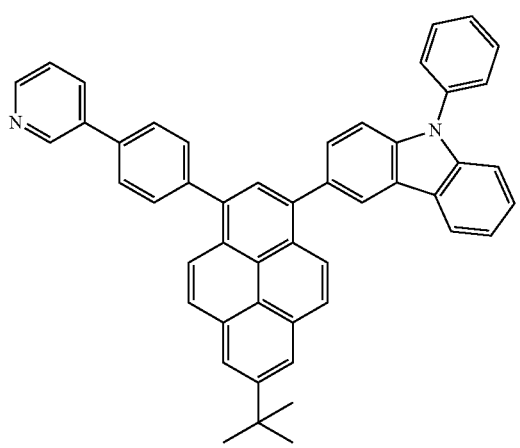

ET10
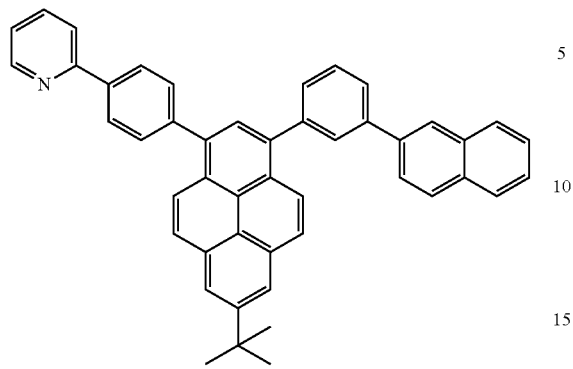
ET11
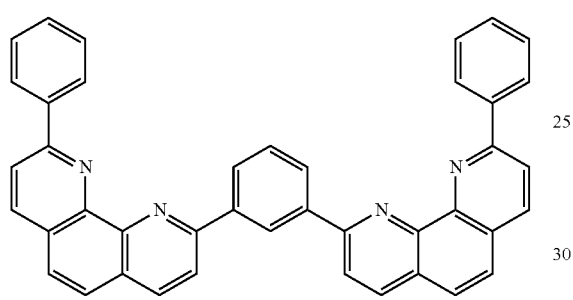
ET12
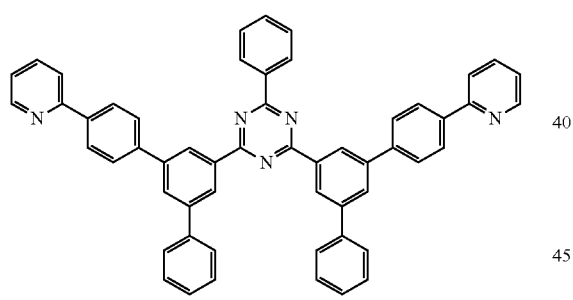
ET13
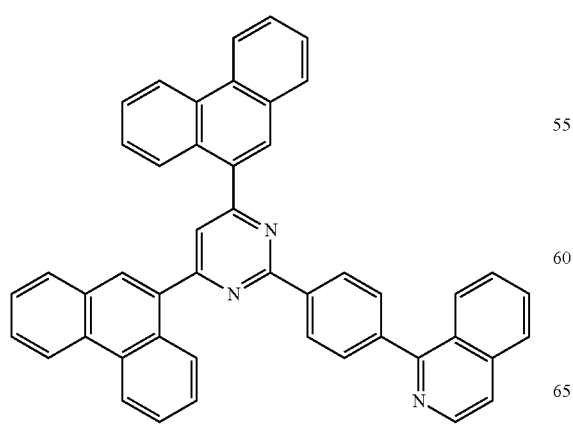
ET14
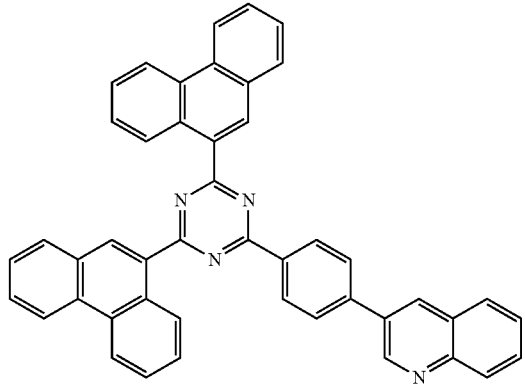
ET15
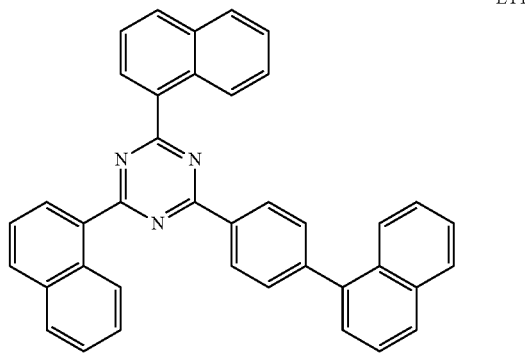
ET16
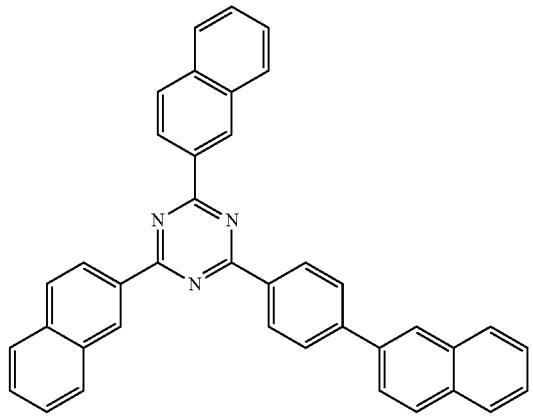
ET17
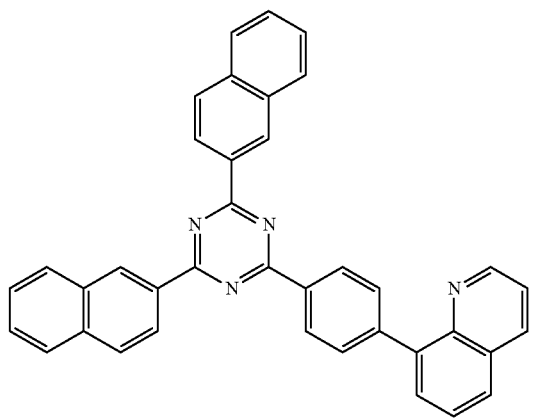

ET18
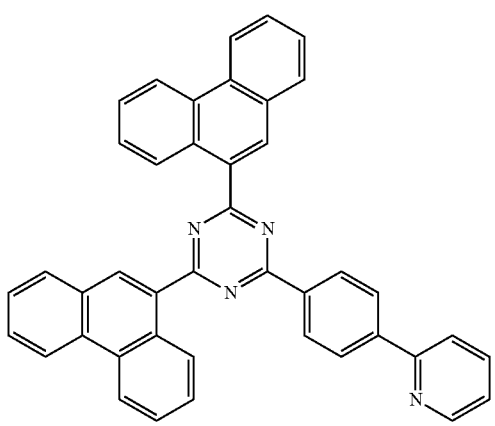
ET19
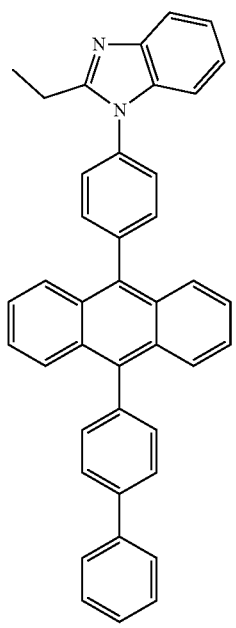
ET20
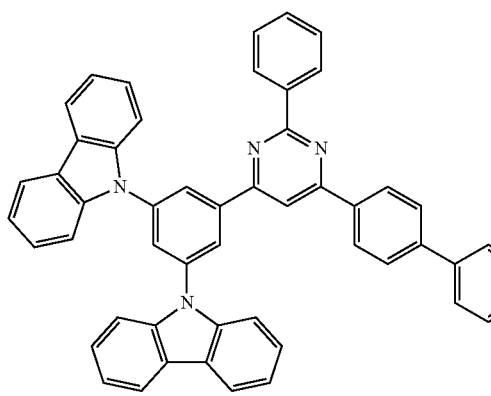
ET21
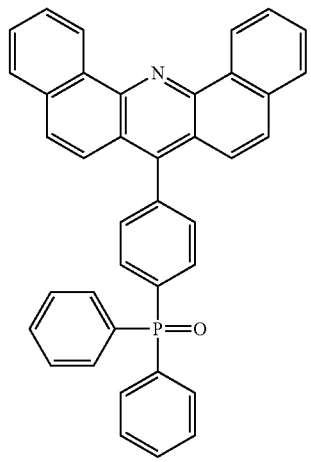
ET22
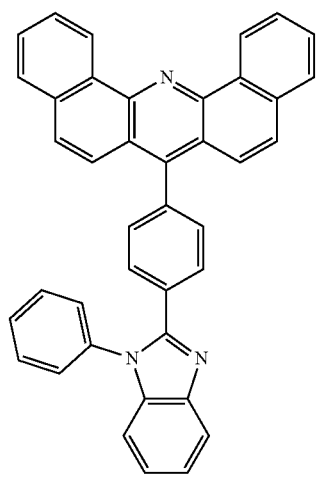
ET23
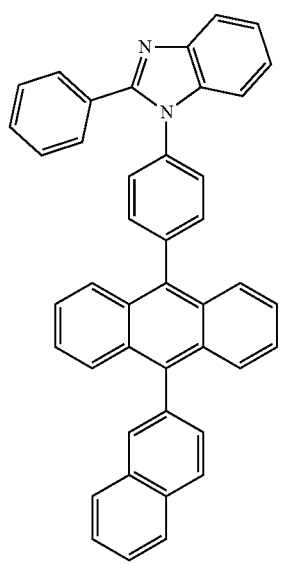

ET24

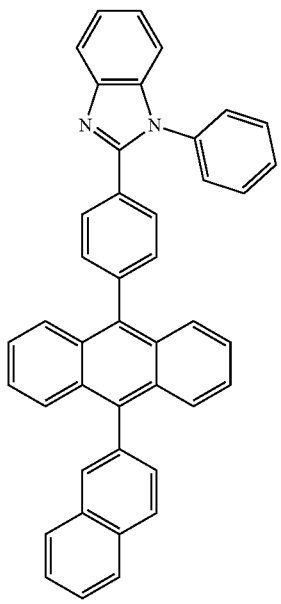

ET25

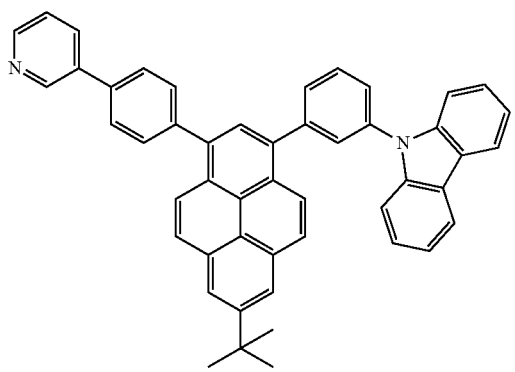

A thickness of the electron transport layer may be in a range of about 100 Å to about 1,000 Å, for example, about 150 Å to about 500 Å. When the thickness of the electron transport layer is within the range described above, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 (LiQ) or Compound ET-D2 below:

ET-D1

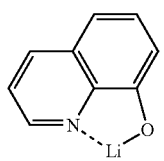

ET-D2

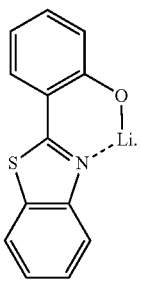

The electron transport region may include an electron injection layer that promotes the flow of electrons from the second electrode 19 thereinto.

The electron injection layer may include at least one LiF, NaCl, CsF, $Li_2O$, and BaO.

A thickness of the electron injection layer may be in a range of about 1 Å to about 100 Å, for example, about 3 Å to about 90 Å. When the thickness of the electron injection layer is within the range described above, satisfactory electron injection characteristics may be obtained without a substantial increase in driving voltage.

The second electrode 19 is located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg-In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom of N, O, P, Si, B, Se, Ge, Te, and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom of N, O, P, Si, B, Se, Ge, Te, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a carbocyclic aromatic system that has at least one heteroatom of N, O, P, Si, B, Se, Ge, Te, and S as a ring-forming atom, and 1 to 60 carbon atoms. The term "$C_1$-$C_{60}$ heteroarylene group" as used herein refers to a divalent group having a carbocyclic aromatic system that has at least one heteroatom of N, O, P, B, Se, Ge, Te, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other.

The term "$C_6$-$C_{60}$ aryloxy group" as used herein indicates -$OA_{102}$ (wherein $A_{102}$ is the $C_6$-$C_{60}$ aryl group), and the term "$C_6$-$C_{60}$ arylthio group" as used herein indicates -$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. An example of the monovalent non-aromatic condensed polycyclic group includes a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom of N, O, P, Si, B, Se, Ge, Te, and S, other than carbon atoms, as a ring-forming atom, and no aromaticity in its entire molecular structure. An example of the monovalent non-aromatic condensed heteropolycyclic group includes a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a saturated or unsaturated cyclic group having, as a ring-forming atom, 5 to 60 carbon atoms only. The $C_5$-$C_{60}$ carbocyclic group may be a monocyclic group or a polycyclic group.

The term "$C_1$-$C_{60}$ heterocyclic group" as used herein refers to a saturated or unsaturated cyclic group having, as a ring-forming atom, at least one heteroatom N, O, P, Si, and S other than 1 to 60 carbon atoms. The $C_1$-$C_{60}$ heterocyclic group may be a monocyclic group or a polycyclic group.

At least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a Cr $C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), or —P(=O)(Q$_{18}$)(Q$_{19}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, or a monovalent non-aromatic condensed heteropolycyclic group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, or a monovalent non-aromatic condensed heteropolycyclic group, each substituted with at least one deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), —P(=O)(Q$_{28}$)(Q$_{29}$), or any combination thereof; or —N(Q$_{31}$)(Q$_{32}$), —Si(Q$_{33}$)(Q$_{34}$)(Q$_{35}$), —B(Q$_{36}$)(Q$_{37}$), or —P(=O)(Q$_{38}$)(Q$_{39}$), Q$_1$ to Q$_9$, Q$_{11}$ to Q$_{19}$, Q$_{21}$ to Q$_{29}$, and Q$_{31}$ to Q$_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with at least one C$_1$-C$_{60}$ alkyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, or a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "'B' was used instead of 'A'" as used in describing Synthesis Examples means that an amount of 'A' used was identical to an amount of 'B' used, in terms of a molar equivalent.

The term "room temperature" as used herein refers to a temperature of about 25° C.

EXAMPLES

Manufacture of Organic Light-Emitting Device

A glass substrate, on which an indium tin oxide (ITO) electrode (first electrode, anode) having a thickness of 1,500 Å was formed, was cleaned by distilled water ultrasonication. After the completion of the distilled water ultrasonication, ultrasonic cleaning was performed with a solvent, such as isopropyl alcohol, acetone, and methanol, and the glass substrate was dried and transferred to a plasma cleaner. The glass substrate was cleaned by using oxygen plasma for 5 minutes, and then, transferred to a vacuum evaporator.

Compound HT3 and Compound HT-D2 were co-deposited on the ITO electrode on the glass substrate to form a hole injection layer having a thickness of 100 Å, and Compound HT3 was deposited on the hole injection layer to form a hole transport layer having a thickness of 1,300 Å, and mCP was deposited on the hole transport layer to form an electron blocking layer having a thickness of 150 Å to form a hole transport region.

Co-hosts including Compound oCBP and Compound mCBP-1CN (at a volume ratio shown in Table 2), Compound PD1 (sensitizer), and Compound FD16 (fluorescent emitter) were co-deposited on the hole transport region to form an emission layer having a thickness of 300 Å.

BCP was vacuum-deposited on the emission layer to form a hole blocking layer having a thickness of 100 Å, and Compound ET3 and LiQ were vacuum-deposited on the hole blocking layer to form an electron transport layer having a thickness of 250 Å, and LiQ was deposited on the electron transport layer to form an electron injection layer having a thickness of 5 Å, and an Al second electrode (cathode) having a thickness of 1,000 Å was formed on the electron injection layer, thereby completing the manufacture of an organic light-emitting device:

HT3

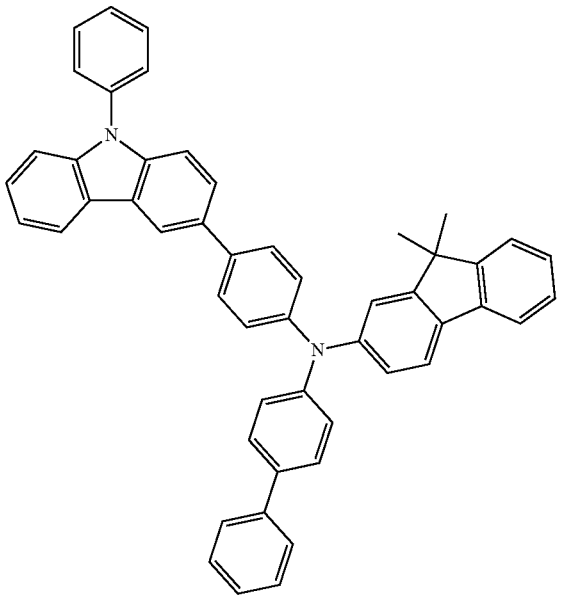

-continued
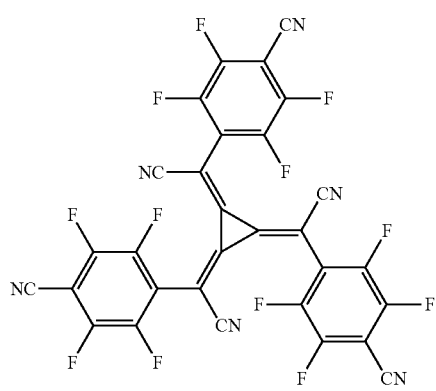
HT-D2
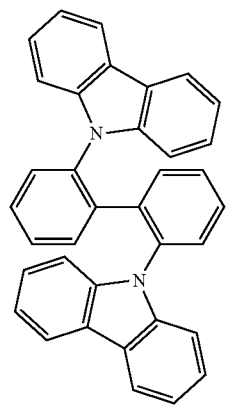
oCBP
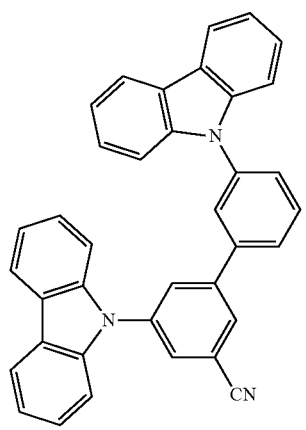
mCBP-1CN
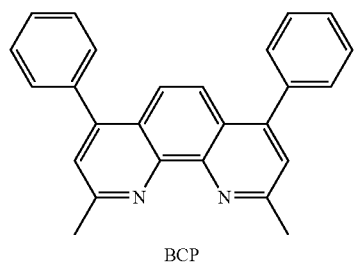
BCP
-continued
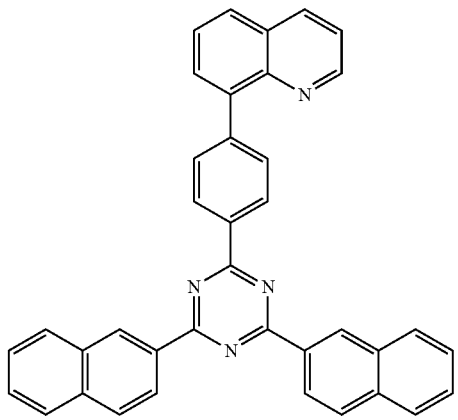
ET3
Next, other organic light-emitting devices were manufactured in the same manner as in Example 1, except that the configuration of the emission layer was changed as shown in Tables 1 and 2 below.
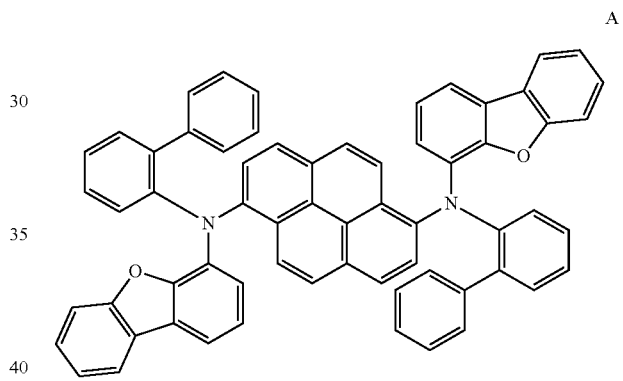
A
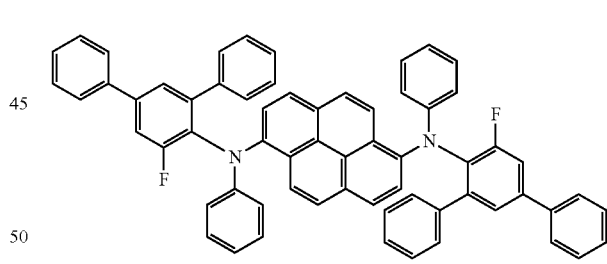
B
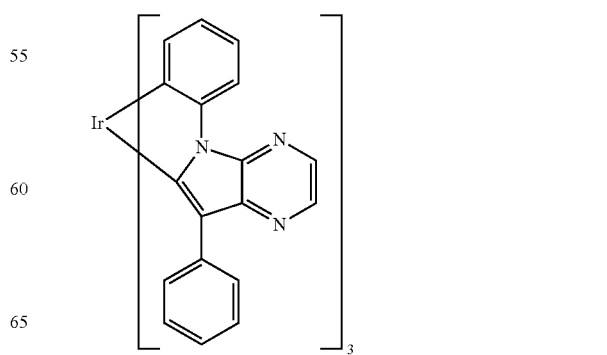
C

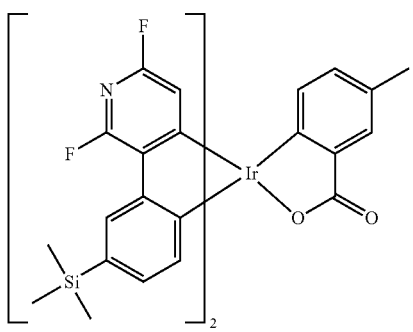

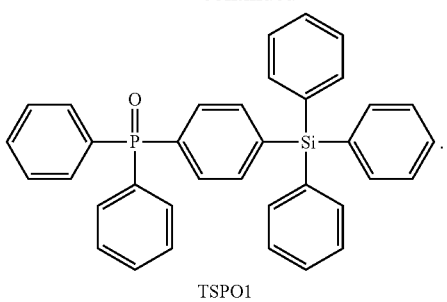

TSPO1

Evaluation Example 1: Evaluation of Energy Level

Regarding the organic light-emitting devices as manufactured above, $E_{adia}^{T1}(SE)$, $E_{vert}^{S1}(FL)$, and Forster transfer rate ($k_{forster}$) were calculated, and the results thereof are shown in Table 1 below. The calculation method is as exemplified herein.

The luminescence decay rate ($k_{rad}$) of the organic light-emitting device is expressed as the total of the luminescence decay rate ($k_{Ph}$) and the Forster transition rate ($k_{forster}$) of the sensitizer:

$$k_{rad} = k_{ph} + k_{forster}.$$

In addition, $k_{rad}$ indicates a value obtained by dividing the luminescence quantum efficiency (PLQY, $\phi_{rad}$) of the organic light-emitting device by the decay time ($\tau_{rad}$), and $k_{Ph}$ indicates a value obtained by diving the luminescence quantum efficiency (PLQY, $\phi_{Ph}$) of the sensitizer by the decay time ($\tau_{Ph}$):

$$k_{rad} = \phi_{rad}/\tau_{rad}$$

$$k_{ph} = \phi_{ph}/\tau_{Ph}.$$

Therefore, $k_{rad}$ and $k_{ph}$ were identified by measuring the decay time and PLQY, and $k_{forster}$ was obtained based on the difference between $k_{rad}$ and $k_{Ph}$ values.

The decay time was measured by multi-exponential fitting a time-resolved photoluminescence (TRPL) spectrum, and then, obtaining a weighted average ($\tau_{avg}$);

$$I(t) = \sum_{i=1}^{4} A_i e^{-\frac{t}{\tau_i}} \quad (I(t)$$

indicates time-dependent intensity of TRPL spectrum)

$$\sum_{i=1}^{4} A_i = 1$$

$$\tau_{avg} = \frac{\sum_{i=1}^{4} A_i \tau_i^2}{\sum_{j=1}^{4} A_j \tau_j}.$$

PLQY was determined by dividing the number of emission photons by the number of absorption photons.

mCBP

TABLE 1

| | Sensitizer | Fluorescent emitter | $E_{adia}^{T1}$(SE) | $E_{vert}^{S1}$(FL) | $\lvert E_{adia}^{T1}$(SE) $- E_{vert}^{S1}$(FL)$\rvert$ (eV) | $k_{forster}$ ($s^{-1}$) |
|---|---|---|---|---|---|---|
| Example 1 | PD1 | FD15 | 2.649 | 2.787 | 0.138 | 4.85E+05 |
| Example 2 | PD1 | FD16 | 2.649 | 2.724 | 0.075 | 9.91E+05 |
| Example 3 | PD1 | FD11 | 2.649 | 2.707 | 0.058 | 2.05E+06 |
| Example 4 | PD2 | FD16 | 2.630 | 2.724 | 0.094 | 7.89E+05 |
| Comparative Example 1 | PD1 | — | 2.649 | | — | — |
| Comparative Example 2 | PD1 | — | 2.649 | | — | — |
| Comparative Example 3 | PD2 | | 2.630 | | | |
| Comparative Example 4 | PD1 | — | 2.649 | | — | — |
| Comparative Example 5 | PD1 | A | 2.649 | 2.867 | 0.218 | 4.10E+05 |
| Comparative Example 6 | PD1 | B | 2.649 | 2.863 | 0.214 | 2.35E+05 |
| Comparative Example 7 | PD2 | B | 2.630 | 2.863 | 0.233 | 1.88E+05 |

Evaluation of Example 2: Evaluation of Properties of Organic Light-Emitting Devices In addition, regarding the organic light-emitting devices as manufactured above, the driving voltage, current density, external quantum efficiency (EQE), and/or lifespan were measured by using a current-voltage meter (Keithley 2400) and a luminance meter (Minolta Cs-1000A), and the results are shown in Table 2 below. The lifespan ($T_{95}$) refers to a time (hr) that is taken for the luminance to become 95% compared to the initial luminance of 100%. The lifespan increase rate shows a relative value by comparing T95 in the case where the organic light-emitting device does not include the fluorescent emitter, with T95 in the case where the organic light-emitting device included the fluorescent emitter.

TABLE 2

| | Host | Sensitizer | Fluorescent emitter | $\lvert E_{adia}^{T1}$(SE) $- E_{vert}^{S1}$(FL)$\rvert$ (eV) | $T_{95}$ (hr)/ lifespan increase rate (%) | Maximum luminescence wavelength/ color coordinate | FWHM (nm) |
|---|---|---|---|---|---|---|---|
| Example 1 | oCBP:mCBP-1CN (6:4) | PD1 | FD15 | 0.138 | 8.44/60.65 | 461/ (0.14, 0.15) | 30 |
| Example 2 | oCBP:mCBP-1CN (5:5) | PD1 | FD16 | 0.075 | 13.01/129.31 | 466/ (0.14, 0.22) | 48 |
| Example 3 | oCBP:mCBP-1CN (6:4) | PD1 | FD11 | 0.058 | 23.27/343.16 | 472/ (0.14, 0.25) | 52 |
| Example 4 | oCBP:mCBP-1CN (5:5) | PD2 | FD16 | 0.094 | 17.63/80.76 | 468/ (0.14, 0.24) | 48 |
| Comparative Example 1 | oCBP:mCBP-1CN (6:4) | PD1 | — | — | 5.25/— | 460/ (0.14, 0.14) | 23 |
| Comparative Example 2 | oCBP:mCBP-1CN (5:5) | PD1 | — | — | 5.67/— | 460/ (0.14, 0.14) | 23 |
| Comparative Example 3 | oCBP:mCBP-1CN (6:4) | PD2 | — | — | 7.97/— | 464/ (0.14, 0.20) | 26 |
| Comparative Example 4 | oCBP:mCBP-1CN (5:5) | PD2 | — | — | 9.75/— | 464/ (0.14, 0.20) | 26 |
| Comparative Example 5 | oCBP:mCBP-1CN (6:4) | PD1 | A | 0.218 | 0.85/−83.85 | 459/ (0.14, 0.14) | 28 |
| Comparative Example 6 | oCBP:mCBP-1CN (6:4) | PD1 | B | 0.214 | 3.58/−31.90 | 459/ (0.14, 0.13) | 25 |
| Comparative Example 7 | oCBP:mCBP-1CN (6:4) | PD2 | B | 0.233 | 5.13/−35.61 | 463/ (0.14, 0.18) | 28 |
| Comparative Example 8 | F | C | FD11 | 0.018 | —/— | 476/ (0.14, 0.27) | 37 |
| Comparative Example 9 | mCBP:TSPO1 (5:5) | D | E | 0.096 | —/— | 462/ (0.14, 0.19) | 80 |

A

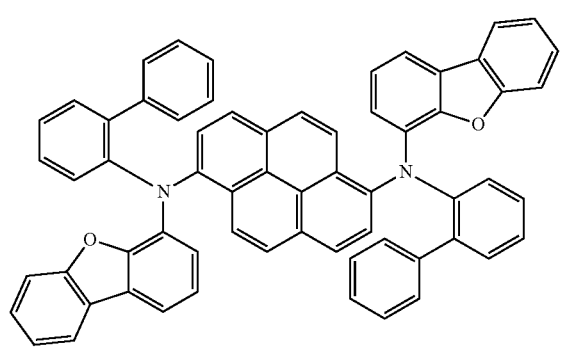

B

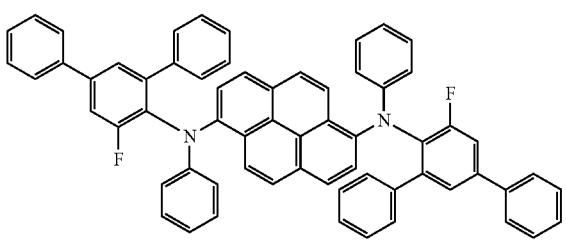

C

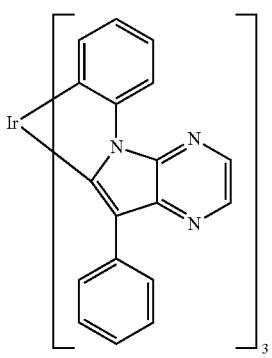

D

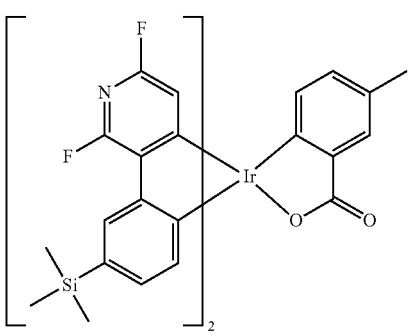

E

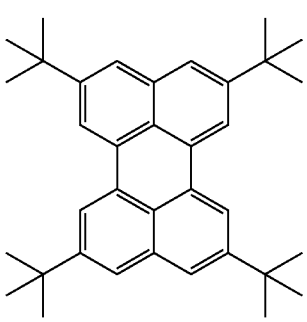

F

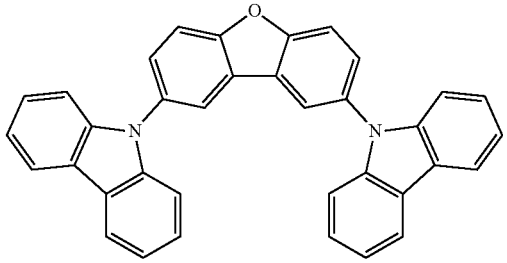

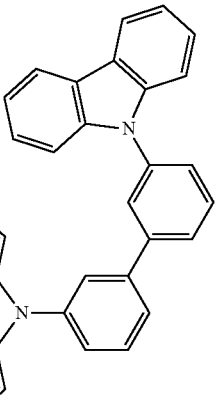

mCBP

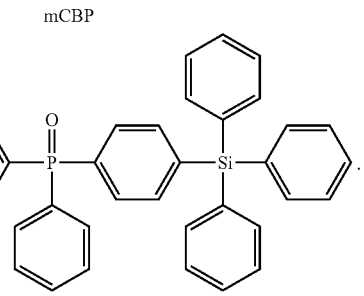

TSPO1

Referring to Tables 1 and 2, it was confirmed that the organic light-emitting device according to an embodiment of the present disclosure had a fast Forster transfer rate and a significantly improved lifespan, and emitted pure deep blue light.

In particular, the organic light-emitting devices of Examples 1 to 4 had fast Forster transfer rates and significantly improved lifespans compared to those of the organic light-emitting devices of Comparative Examples 1 to 7.

The organic light-emitting devices of Comparative Examples 8 and 9 included a complex compound having iridium as a central metal, and in this regard, the organic light-emitting device of Comparative Example 8 showed a longer maximum luminescence wavelength than the organic light-emitting devices of Examples 1 to 4, and the organic light-emitting device of Comparative Example 9 showed a significantly wider FWHM than the organic light-emitting devices of Examples 1 to 4. Therefore, it was found that the organic light-emitting devices of Examples 1 to 4 had excellent luminescence characteristics of blue light compared to the organic light-emitting devices of Comparative Examples 8 and 9.

According to the one or more embodiments, an organic light-emitting device may emit fluorescence with a narrow FWHM, and have high efficiency and long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:
a first electrode; a second electrode; and an organic layer between the first electrode and the second electrode, wherein
the organic layer comprises an emission layer,
the emission layer comprises a sensitizer, a fluorescent emitter, and a host, the sensitizer comprises ruthenium (Ru), palladium (Pd), rhenium (Re), osmium (Os), platinum (Pt), or any combination thereof,
and
the sensitizer and the fluorescent emitter satisfy Inequality 1 below:

$$|E_{adia}^{T1}(SE) - E_{vert}^{S1}(FL)| < 0.2 \text{ eV} \qquad \text{Inequality 1}$$

In Inequality 1,
$E_{adia}^{T1}(SE)$ indicates an adiabatic triplet excitation energy of the sensitizer, and
$E_{vert}^{S1}(FL)$ indicates a vertical singlet excitation energy of the fluorescent emitter,
wherein the fluorescent emitter is a compound represented by Formula 511:

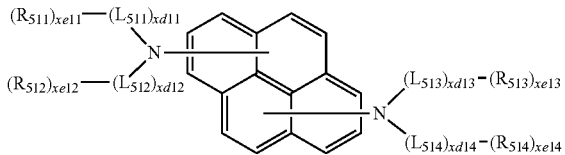

Formula 511 wherein, in Formula 511,
$L_{511}$ to $L_{514}$ are each independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group,
xd11 to xd14 are each independently 1, 2, 3, 4, or 5,
$R_{511}$ to $R_{514}$ are each independently a phenyl group, a biphenyl group, a terphenyl group, a fluorenyl group, a spiro-bifluorenyl group, a benzofluorenyl group, a dibenzofluorenyl group, a phenanthrenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group; or a phenyl group, a biphenyl group, a terphenyl group, a fluorenyl group, a spiro-bifluorenyl group, a benzofluorenyl group, a dibenzofluorenyl group, a phenanthrenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one of deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a fluorenyl group, a spiro-bifluorenyl group, a benzofluorenyl group, a dibenzofluorenyl group, a phenanthrenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof, and xe11 to xe14 are each independently 0, 1, 2, 3, 4, 5, 6, 7, or 8.

2. The organic light-emitting device of claim 1, wherein the sensitizer comprises an organometallic compound represented by Formula 101 below:

$$M_{11}(L_{11})_{n11}(L_{12})_{n12} \qquad \text{Formula 101}$$

In Formula 101,
$M_{11}$ is Ru, Pd, Re, Os, or Pt;
$L_{11}$ is a ligand represented by one of Formulae 1-1 to 1-4 below;
$L_{12}$ is a monodentate ligand or a bidentate ligand;
n11 is 1; and
n12 is 0, 1, or 2,
wherein when n12 is 2, then each occurrence of $L_{12}$ is the same or different,

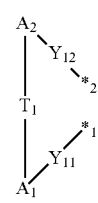

1-1

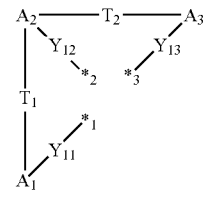

1-2

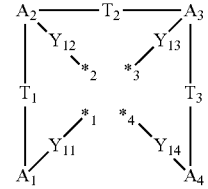

1-3

-continued

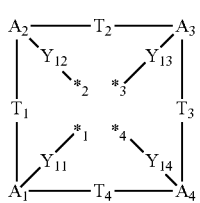

1-4 wherein, in Formulae 1-1 to 1-4, $A_1$ to $A_4$ are each independently a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ are each independently a chemical bond, O, S, $N(R_{91})$, $B(R_{91})$, $P(R_{91})$, or $C(R_{91})(R_{92})$, $T_1$ to $T_4$ are each independently a single bond, a double bond, *—$N(R_{93})$—*′, *—$B(R_{93})$—*′, *—$P(R_{93})$—*′, *—$C(R_{93})(R_{94})$—*′, *—$Si(R_{93})(R_{94})$—*′, *—$Ge(R_{93})(R_{94})$—*′, *—S—*′, *—Se—*′, *—O—*′, *—C(=O)—*′, *—S(=O)—*′, *—S(=O)$_2$—*′, *—C($R_{93}$)—*′, *=C($R_{93}$)—*′, *—C($R_{93}$)=C($R_{94}$)—*′, *—C(=S)—*′, or *—C≡C—*′, a substituent of the $C_5$-$C_{30}$ carbocyclic group, a substituent of the substituted $C_1$-$C_{30}$ heterocyclic group, and $R_{91}$ to $R_{94}$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$),

*$_1$, *$_2$, *$_3$, and *$_4$ each indicate a binding site to $M_{11}$, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with deuterium, —F, a cyano group, a $C_1$-$C_{60}$ alkyl group, a $C_6$-$C_{60}$ aryl group, or any combination thereof.

3. The organic light-emitting device of claim 1, wherein the sensitizer comprises an organometallic compound represented by Formula 111 below:

Formula 111

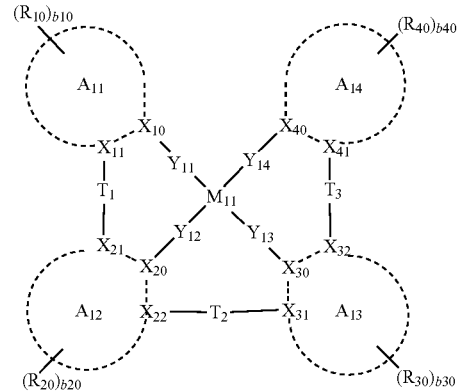

In Formula 111, $M_{11}$, $Y_{11}$ to $Y_{14}$, and $T_1$ to $T_3$ are each the same as described in claim 2, $A_{11}$ to $A_{14}$ are each independently a substituted or unsubstituted $C_5$-$C_{30}$ carbocyclic group, a substituted or unsubstituted $C_1$-$C_{30}$ heterocyclic group, or a non-cyclic group, $X_{10}$, $X_{11}$, $X_{20}$ to $X_{22}$, $X_{30}$ to $X_{32}$, $X_{40}$, and $X_{41}$ are each independently C or N, $R_{10}$, $R_{20}$, $R_{30}$, and $R_{40}$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O) ($Q_1$), —S(=O)($Q_1$), —S(=O)$_2$($Q_1$), —P(=O)($Q_1$) ($Q_2$), or —P(=S)($Q_1$)($Q_2$), $b_{10}$, $b_{20}$, $b_{30}$, and $b_{40}$ are each independently an integer from 1 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_0$-$C_{00}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{00}$ aryl group, or any combination thereof, or a $C_6$-$C_{60}$ aryl group that is substituted with at least one deuterium, —F, a cyano group, a $C_1$-$C_{60}$ alkyl group, a $C_6$-$C_{60}$ aryl group, or any combination thereof.

4. The organic light-emitting device of claim 1, wherein the sensitizer comprises Pt.

5. The organic light-emitting device of claim 1, wherein a luminescence spectrum in a film state of the sensitizer has a full-width at half maximum (FWHM) of about 10 nm to about 50 nm.

6. The organic light-emitting device of claim 1, wherein the fluorescent emitter does not comprise a metal atom.

7. The organic light-emitting device of claim 1, wherein the fluorescent emitter satisfies Inequality 2 below:

$$|T1(FL)-S1(FL)|>0.2 \text{ eV} \qquad \text{Inequality 2}$$

wherein, in Inequality 2,
T1(FL) indicates a lowest excitation triplet energy level of the fluorescent emitter, and
S1(FL) indicates a lowest excitation singlet energy level the fluorescent emitter.

8. The organic light-emitting device of claim 1, wherein an emission wavelength of the fluorescent emitter comprises a maximum emission wavelength of about 410 nm to about 490 nm.

9. The organic light-emitting device of claim 1, wherein the host has a triplet energy level of about 2.9 eV or more.

10. The organic light-emitting device of claim 1, wherein the host comprises at least one a fluorene-containing compound, a carbazole-containing compound, a dibenzofuran-containing compound, a dibenzothiophene-containing compound, an indenocarbazole-containing compound, an indolocarbazole-containing compound, a benzofurocarbazole-containing compound, a benzothienocarbazole-containing compound, an acridine-containing compound, a dihydroacridine-containing compound, a triindolobenzene-containing compound, pyridine-containing compound, a pyrimidine-containing compound, a triazine-containing compound, a silicon-containing compound, a cyano group-containing compound, a phosphine oxide-containing compound, a sulfoxide-containing compound, a sulfonyl-containing compound, or any combination thereof.

11. The organic light-emitting device of claim 1, wherein the host is a mixture of two or more different compounds.

12. The organic light-emitting device of claim 1, wherein the emission layer consists of the host, the sensitizer, and the fluorescent emitter.

13. The organic light-emitting device of claim 1, wherein the host and the sensitizer each do not emit light.

14. The organic light-emitting device of claim 1, wherein the emission layer emits blue light having a maximum emission wavelength of about 410 nm to about 490 nm.

15. The organic light-emitting device of claim 1, wherein in the emission layer, an amount of the sensitizer is greater than that of the fluorescent emitter.

16. The organic light-emitting device of claim 1, wherein
in the emission layer, a volume ratio of the host and the sensitizer is about 60:40 to about 95:5, and
in the emission layer, a volume ratio of the sensitizer and the fluorescent emitter is about 30:0.1 to about 10:3.

* * * * *